(12) United States Patent
Shin

(10) Patent No.: US 12,243,726 B2
(45) Date of Patent: Mar. 4, 2025

(54) SUBSTRATE SUPPORTING UNIT, APPARATUS FOR TREATING SUBSTRATE INCLUDING THE SAME, AND RING TRANSFER METHOD

(71) Applicant: SEMES CO., LTD., Cheonan-si (KR)

(72) Inventor: Jae-Won Shin, Seoul (KR)

(73) Assignee: Semes Co., Ltd., Cheonan-si (KR)

( * ) Notice: Subject to any disclaimer, the term of this patent is extended or adjusted under 35 U.S.C. 154(b) by 266 days.

(21) Appl. No.: 18/066,003

(22) Filed: Dec. 14, 2022

(65) Prior Publication Data

US 2024/0153747 A1    May 9, 2024

(30) Foreign Application Priority Data

Nov. 9, 2022    (KR) .......................... 10-2022-0149011

(51) Int. Cl.
*H01J 37/32* (2006.01)

(52) U.S. Cl.
CPC .. *H01J 37/32642* (2013.01); *H01J 37/32715* (2013.01); *H01J 2237/3343* (2013.01)

(58) Field of Classification Search
None
See application file for complete search history.

(56) References Cited

U.S. PATENT DOCUMENTS

| | | | | | |
|---|---|---|---|---|---|
| 3,290,723 | A | * | 12/1966 | Arthur | H05H 1/42 |
| | | | | | 425/383 |
| 6,182,602 | B1 | * | 2/2001 | Redeker | H01J 37/32449 |
| | | | | | 118/728 |

(Continued)

FOREIGN PATENT DOCUMENTS

| | | | | |
|---|---|---|---|---|
| GB | 2590083 | A | * 6/2021 | ............ C02F 1/4608 |
| JP | 2004-026365 | A | 1/2004 | |

(Continued)

OTHER PUBLICATIONS

Office Action for Korean Application No. 10-2022-0149011 dated Apr. 25, 2024.

*Primary Examiner* — Srinivas Sathiraju
(74) *Attorney, Agent, or Firm* — Harness, Dickey & Pierce, P.L.C.

(57) ABSTRACT

The inventive concept provides a substrate treating apparatus. The substrate treating apparatus includes a process chamber having a treating space therein; a substrate support unit configured to support a substrate in the treating space; a gas supply unit configured to supply a process gas to the treating space; and a plasma source for generating a plasma from the process gas, and wherein the substrate support unit includes: a support plate on which the substrate is placed; a base which is positioned below the support plate; a first ring provided to surround the substrate placed on the support unit; a second ring provided below the first ring and having a through hole; and a ring lift pin assembly for lifting and lowering the first ring and the second ring, and wherein the ring lift pin assembly includes: a first pin provided to be inserted into the through hole and to lift and lower the first ring; a second pin in a hollow shaft shape to lift and lower the second ring and having a hole at which first pin passes through within; and a driving unit for driving the first pin and the second pin, and wherein the through hole overlaps the first ring when seen from above.

17 Claims, 25 Drawing Sheets

(56) References Cited

U.S. PATENT DOCUMENTS

| | | | |
|---|---|---|---|
| 11,587,770 B2* | 2/2023 | Gu | H01J 37/32715 |
| 2003/0062128 A1* | 4/2003 | Denpoh | H01J 37/32642 |
| | | | 118/724 |
| 2005/0056370 A1* | 3/2005 | Brown | H01L 21/67069 |
| | | | 156/345.51 |
| 2006/0231029 A1* | 10/2006 | Blonigan | H01J 37/32577 |
| | | | 118/722 |
| 2007/0007660 A1* | 1/2007 | Nguyen | H01L 21/68735 |
| | | | 257/776 |
| 2007/0029046 A1* | 2/2007 | Li | C23C 16/505 |
| | | | 118/723 R |
| 2013/0160948 A1* | 6/2013 | Shih | C23C 16/56 |
| | | | 118/723 R |
| 2015/0380220 A1* | 12/2015 | Tan | H01J 37/32724 |
| | | | 219/443.1 |
| 2016/0071722 A1* | 3/2016 | Miura | H01J 37/32366 |
| | | | 156/345.55 |
| 2016/0230281 A1* | 8/2016 | Lin | H01J 37/32724 |
| 2016/0314937 A1* | 10/2016 | Carducci | H01J 37/32568 |
| 2016/0314940 A1* | 10/2016 | Carducci | H05H 1/46 |
| 2016/0314942 A1* | 10/2016 | Carducci | H05H 1/46 |
| 2016/0322200 A1* | 11/2016 | Alayavalli | C23C 16/45565 |
| 2016/0326061 A1* | 11/2016 | Sun | H01L 21/67069 |
| 2017/0301565 A1* | 10/2017 | Fang | H01L 21/67028 |
| 2017/0301566 A1* | 10/2017 | Fang | H01J 37/32642 |
| 2017/0350688 A1* | 12/2017 | Boyd, Jr. | G01B 11/14 |
| 2018/0044783 A1* | 2/2018 | Sheelavant | H01J 37/32623 |
| 2018/0144903 A1* | 5/2018 | Shaikh | H01J 37/32935 |
| 2018/0230597 A1* | 8/2018 | Ma | H01J 37/32 |
| 2018/0233334 A1* | 8/2018 | Luere | H01J 37/32642 |
| 2018/0277416 A1* | 9/2018 | Takahashi | H01L 21/68785 |
| 2019/0074165 A1* | 3/2019 | Hong | H01J 37/3266 |
| 2019/0363003 A1* | 11/2019 | Sarode Vishwanath | |
| | | | H01L 21/68735 |
| 2020/0395196 A1* | 12/2020 | Hong | H01L 21/6831 |
| 2021/0142989 A1* | 5/2021 | Iizuka | H01L 21/3065 |
| 2022/0301833 A1* | 9/2022 | Hayashi | H01J 37/32449 |
| 2023/0017324 A1* | 1/2023 | Leonov | H05H 1/247 |
| 2023/0215706 A1* | 7/2023 | Choi | H01L 21/6831 |
| | | | 156/345.51 |
| 2023/0326725 A1* | 10/2023 | Takahashi | H01L 21/67103 |
| | | | 118/723 E |
| 2023/0402257 A1* | 12/2023 | Chen | H01L 21/67069 |
| 2024/0153747 A1* | 5/2024 | Shin | H01J 37/32715 |
| 2024/0170253 A1* | 5/2024 | Yoshino | H01J 37/321 |
| 2024/0200455 A1* | 6/2024 | Altunin | F01K 3/188 |

FOREIGN PATENT DOCUMENTS

| | | | | |
|---|---|---|---|---|
| KR | 10-2016-0088820 A | | 7/2016 | |
| KR | 10-2020-0086626 A | | 7/2020 | |
| WO | WO-2010099007 A1 | * | 9/2010 | C23C 14/00 |

* cited by examiner

SUBSTRATE SUPPORTING UNIT, APPARATUS FOR TREATING SUBSTRATE INCLUDING THE SAME, AND RING TRANSFER METHOD

CROSS-REFERENCE TO RELATED APPLICATIONS

A claim for priority under 35 U.S.C. § 119 is made to Korean Patent Application No. 10-2022-0149011 filed on Nov. 9, 2022, in the Korean Intellectual Property Office, the entire contents of which are hereby incorporated by reference.

BACKGROUND

Embodiments of the inventive concept described herein relate to a substrate support unit, a substrate treating apparatus having the same, and a ring transfer method.

A plasma refers to an ionized gas state composed of ions, radicals, and electrons. The plasma is produced by a very high temperatures, a strong electric field, or a high frequency electromagnetic field (RF electromagnetic field). A semiconductor device manufacturing process may include an etching process of removing a thin film formed on a substrate such as a wafer using the plasma. The etching process is performed by colliding ions and/or radicals of the plasma with the thin film on the substrate or reacting with the thin film.

A substate treating apparatus using the plasma includes a process chamber, a support assembly for supporting the substrate in the process chamber, and a plasma source for generating the plasma from a gas for treating the substrate. The support assembly includes an electrostatic chuck fixing the substrate by an electrostatic force and a focus ring surrounding an outer circumference of the substrate seated on the electrostatic chuck. The focus ring distributes the plasma with a high uniformly on a surface of the substrate. When an etching is repeatedly performed on the substrate, the focus ring is also etched, thereby gradually changing a form of the focus ring. According to a change in the form of the focus ring, a direction in which ions and/or radicals are incident on the substrate is changed, and thus etching characteristics for the substrate are changed.

Therefore, when an etching treatment on the substrate is repeatedly performed, or when a form shape of the focus ring is changed and is outside an allowable range, a replacement of the focus ring is required. Generally, the replacement of the focus ring is accomplished by an operator opening the process chamber, taking out a used focus ring from an open process chamber, and mounting an unused focus ring to the process chamber.

However, such a replacement method not only requires a lot of work time, but also has a high possibility that particles are introduced into the process chamber. Accordingly, recently, a replacement method is used whereby the used focus ring is taken out from the process chamber and introduced to a ring pod by a transfer robot of the substrate treating apparatus, and then a new focus ring is taken out from the ring pod and introduced into the process chamber by the transfer robot.

A transfer of the focus ring may be performed by the transfer robot which transfers the substrate. The support assembly is provided with a lift pin for lifting/lowering the focus ring from the support assembly or seating the focus ring on the support assembly to transfer the focus ring. A plurality of focus rings are provided according the amount needed. If the plurality of focus rings are provided, a structure of the lift pin for lifting or lowering the focus ring determines an ease of transfer, a transfer time, and a height of the process chamber.

SUMMARY

Embodiments of the inventive concept provide a substrate support unit and a substrate treating apparatus having the same, and a ring transfer method for conveniently transferring a plurality of focus rings.

Embodiments of the inventive concept provide a substrate support unit and a substrate treating apparatus having the same, and a ring transfer method for minimizing a height of a process chamber.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a process chamber having a treating space therein; a substrate support unit configured to support a substrate in the treating space; a gas supply unit configured to supply a process gas to the treating space; and a plasma source for generating a plasma from the process gas, and wherein the substrate support unit includes: a support plate on which the substrate is placed; a base which is positioned below the support plate; a first ring provided to surround the substrate placed on the support unit; a second ring provided below the first ring and having a through hole; and a ring lift pin assembly for lifting and lowering the first ring and the second ring, and wherein the ring lift pin assembly includes: a first pin provided to be inserted into the through hole and to lift and lower the first ring; a second pin in a hollow shaft shape to lift and lower the second ring and having a hole at which first pin passes through within; and a driving unit for driving the first pin and the second pin, and wherein the through hole overlaps the first ring when seen from above.

In an embodiment, a bottom surface of the first ring and a top surface of the second ring contact each other at the substrate support unit.

In an embodiment, the first pin is provided to be able to protrude from a top of the second pin.

In an embodiment, the driving unit includes: a first driving mechanism for lifting and lowering the first pin; and a second driving mechanism for lifting and lowering the second pin.

In an embodiment, the first pin is positioned at a more bottom side than the first ring while the substrate is being treated, and the second pin is positioned at a more bottom side than the second ring while the substrate is being treated, and the first pin moves in an upward direction while the first ring is transferred to contact the bottom surface of the first ring, and the second pin moves in the upward direction while the second ring is transferred to contact a bottom surface of the second ring.

In an embodiment, the substrate treating apparatus further includes: a transfer unit for taking in and taking out the first ring or the second ring to/from inside of the process chamber; and a controller configured to control the driving unit and the transfer unit, and wherein the controller configured to control the driving unit to lift the first pin from a bottom side of the first ring to a top side of the support plate, and configured to control the transfer unit to receive the first ring from the first pin, while the first ring is transferred.

In an embodiment, the controller configured to control the second pin to be lifted from a bottom side of the second ring to a top side of the support plate, and configured to control the transfer unit to receive the second ring from the second pin, while the second ring is transferred.

In an embodiment, the controller configured to control the driving unit and the transfer unit to lift the second ring after the first ring is taken to the transfer unit.

In an embodiment, the substrate treating apparatus further includes: a transfer unit for taking in and taking out the first ring or the second ring to/from inside of the process chamber; and a controller configured to control the driving unit and the transfer unit, and wherein the controller configured to control the transfer unit to take the second ring to the second pin, after the second ring is positioned so the through hole of the second ring and the first pin overlap when seen from above, when the second ring is mounted on the support plate, and configured to control the driving unit to lower the second pin so the second ring is mounted on the support plate.

In an embodiment, the controller configured to control the transfer unit to transfer the first ring to the first pin, when the first ring is mounted on the support plate, after the second ring is mounted on the support plate, and configured to control the driving unit to lower the first pin so the first ring is mounted on the support plate.

The inventive concept provides a substrate support unit provided within a process chamber and having a substrate placed thereon. The substrate support unit includes a support plate on which the substrate placed; a first ring provided to surround the substrate placed on the support plate; a second ring provided below the first ring and having a through hole; and a ring lift pin assembly for lifting and lowering the first ring and the second ring, and wherein the ring lift pin assembly includes: a first pin provided to be inserted into the through hole and for lifting and lowering the first ring; a second pin in a hollow shape for lifting and lowering the second ring and having a hole for letting the first pin passes through within; and a driving unit for driving the first pin and the second pin, and wherein the through hole overlaps the first ring when seen from above.

In an embodiment, a bottom surface of the first ring and a top surface of the second ring are placed to contact each other on the substrate support unit.

In an embodiment, the first pin is provided to so it may protrude from a top of the second pin.

In an embodiment, the first pin is positioned at a more bottom side than the first ring while the substrate is being treated, and the second pin is positioned at a more bottom side than the second ring while the substrate is being treated, and the first pin moves in an upward direction while the first ring is transferred to contact a bottom surface of the first ring, and the second pin moves in the upward direction while the second ring is transferred to contact a bottom surface of the second ring.

In an embodiment, the substrate support unit further includes a controller configured to control the driving unit, and wherein the controller configured to control the driving unit to remove the first ring from the first pin after the first pin is lifted from a bottom side of the first ring to a top side of the support plate, while the first ring is transferred to an outside of the process chamber, and to remove the second ring from the second pin after the second pin is lifted from a bottom side of the second ring to a top side of the support plate, while the second ring is transferred to an outside of the process chamber.

In an embodiment, the second ring is transferred to the outside of the process chamber after the first ring is transferred to the outside of the process chamber.

In an embodiment, the controller configured to control the driving unit to mount the second ring on the support plate by lowering the second pin having the second ring mounted thereon, and to mount the first ring on the support plate by lowering the first pin having the first ring mounted thereon, after the second ring is mounted on the support plate.

The inventive concept provides a ring transfer method for transferring the first ring and the second ring by using the substrate treating apparatus of claim 1. The ring transfer method includes removing the first ring from the first pin after lifting the first pin from a bottom side of the first ring to a top side of the support plate, while the first ring and the second ring are transferred to an outside of the process chamber, and removing the second ring from the second pin after the second pin is lifted from a bottom side of the second ring to a top side of the support plate, while the first ring and the second ring are transferred to an outside of the process chamber.

In an embodiment, the second ring is transferred to the outside of the process chamber, after the first ring is transferred to the outside of the process chamber.

In an embodiment, the second ring and the first ring are sequentially transferred while the first ring and the second ring is transferred to an inside of the process chamber, and the second ring is mounted on the support plate by taking the second ring to the second pin and lowering the second pin mounted on the second ring, after the second ring is positioned to overlap with the through hole of the second ring when seen from above, while the second ring is mounted on the support plate, and the first ring is mounted on the support plate by taking the first ring to the first pin and lowering the first pin mounted on the first ring, while the first ring is mounted on the support plate.

According to an embodiment of the inventive concept, a plurality of focus rings may be conveniently transferred.

According to an embodiment of the inventive concept, a height of a process chamber may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
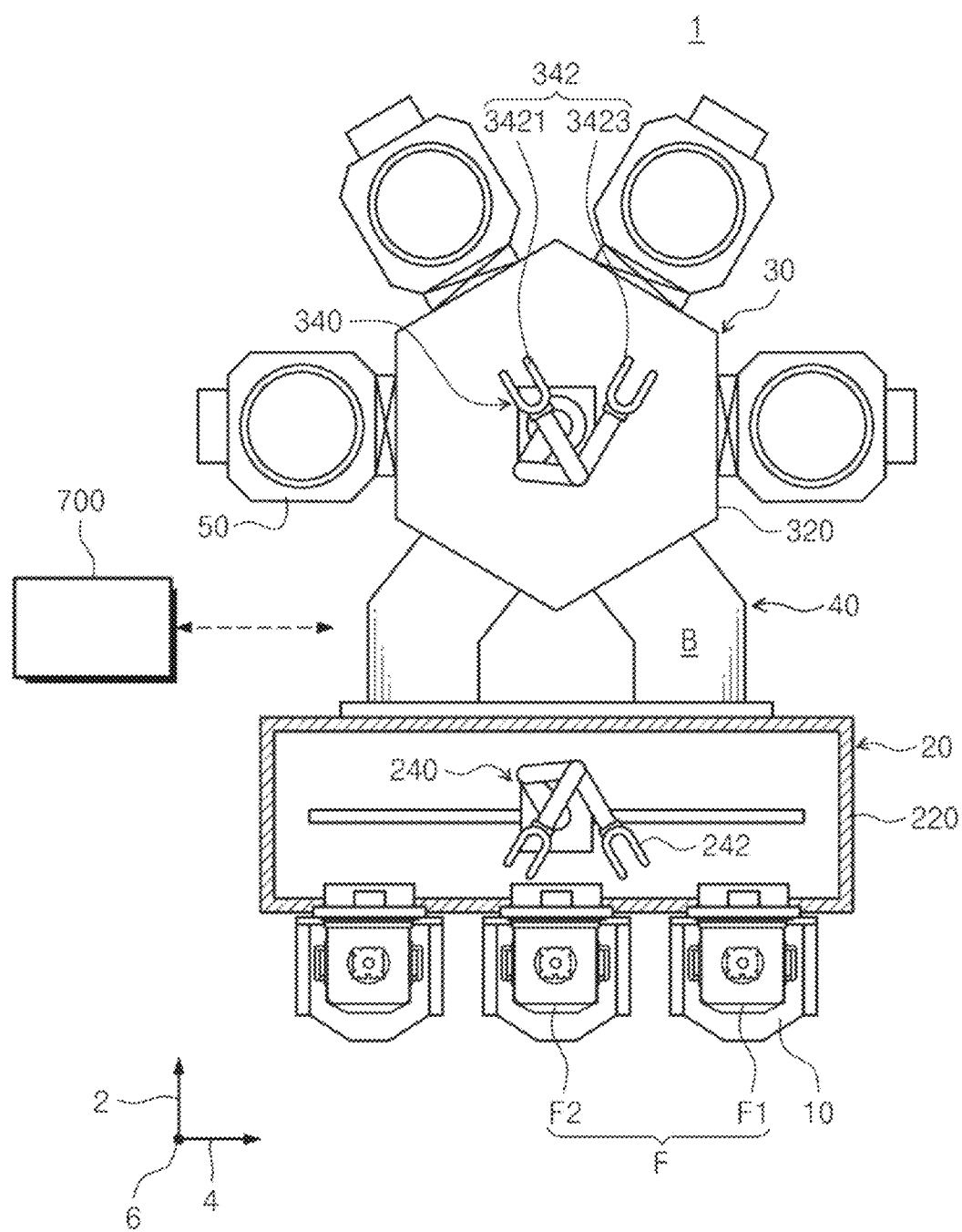
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, an embodiment of the inventive concept will be described in detail with reference to FIG. 1 to FIG. 35.

FIG. 1 schematically illustrates a substrate treating apparatus according to an embodiment of the inventive concept. Referring to FIG. 1, the substrate treating apparatus 1 according to an embodiment of the inventive concept may include a load port 10, an atmospheric pressure transfer module 20, a vacuum transfer module 30, a load lock chamber 40, and a process chamber 50.

The load port 10 may be disposed on a side of the atmospheric pressure transfer module 20 to be described later. One or more load ports 10 may be provided. The number of load ports 10 may increase or decrease according to a process efficiency, foot print conditions, and the like. A container F according to an embodiment of the inventive concept may be placed in the load port 10. The container F may be loaded onto or unloaded from the load port 10 by a transfer means (not shown) such as an overhead transfer apparatus (OHT), an overhead conveyor, or an automatic guided vehicle, or by an operator. The container F may include various types of containers according to a type of an article to be stored. As the container F, an airtight container such as a front opening integrated pod (FOUP) may be used.

Various articles may be stored within the container F. The container F may include various types of containers according to a type of an article to be stored. For example, an object to be treated by the substrate treating apparatus 1 may be stored within a first container F1, which is one of the containers F. The object to be treated may be a substrate W such as a wafer. A support slot (not shown) on which the substrate W is seated may be provided at the first container F1.

In addition, within a second container F2, which is another one of the containers F, a ring member R1 and R2 (see FIG. 7 and FIG. 8) mounted on the substrate treating apparatus 1 and requiring replacement may be stored. The ring member R1 and R2 may be a focus ring or a dielectric ring installed at the process chamber 50 to be described later. In an embodiment, the ring member R1 and R2 may include a first ring R1 and a second ring R2 having an inner diameter and an outer diameter which is larger than the first ring R1.

A support slot (not shown) on which the ring member R1 and R2 is seated may be provided at the second container F2. Selectively, the ring member R1 and R2 and the ring carrier 60 supporting the ring member R1 and R2 may be stored within the second container F2 (See FIG. 9). A support slot (not shown) on which the ring carrier 60 is seated may be provided at the second container F2. An outer circumferential diameter of the ring member R1 and R2 may have a diameter larger than an outer circumferential diameter of the substrate W. Accordingly, the space in the second container F2 may have a slightly larger volume than the space in the first container F1.

The atmospheric pressure transfer module 20 and the vacuum transfer module 30 may be arranged in a first direction 2. Hereinafter, when viewed from above, a direction perpendicular to the first direction 2 is defined as a second direction 4. In addition, a direction perpendicular to a plane including both the first direction 2 and the second direction 4 is defined as a third direction 6. Here, the third direction 6 is a direction perpendicular to the ground.

The atmospheric pressure transfer module 20 may selectively transfer the substrate W or the ring member R1 and R2 between the container F and the load lock chamber 40 to be described later. For example, the atmospheric pressure transfer module 20 may take out the substrate W from the first container F1 and transfer the substrate W to the load lock chamber 40, or may take out the substrate W from the load lock chamber 40 and transfer the substrate W to the container F. The atmospheric pressure transfer module 20 may include a transfer frame 220 and a first transfer robot 240. The transfer frame 220 may be provided between the load port 10 and the load lock chamber 40. That is, the load port 10 may be connected to the transfer frame 220. The transfer frame 220 may be provided with an atmospheric pressure therein. An inside of the transfer frame 220 may be maintained in an atmospheric pressure atmosphere.

Figure 2:
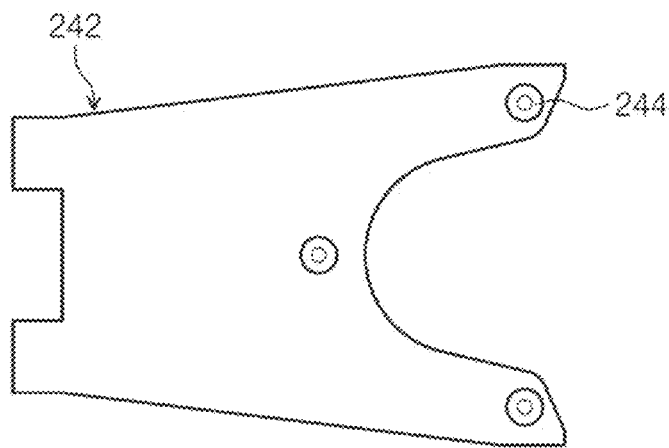
FIG. 2 schematically illustrates a first transfer hand of FIG. 1.

The transfer frame 220 may be provided with a first transfer robot 240. The first transfer robot 240 may selectively transfer the substrate W or the ring member R1 and R2 between the container F seated on the load port 10 and the load lock chamber 40 to be described later. The first transfer robot 240 may move in a up/down direction. The first transfer robot 240 may have a first transfer hand 242 that moves forwardly, backwardly, or rotates on a horizontal plane. One or a plurality of first transfer hands 242 of the first transfer robot 240 may be provided. In an embodiment, a plurality of first transfer hands 242 may be provided. The substrate W may be placed on the first transfer hand 242. Selectively, a ring carrier 60 to be described later supporting the ring member R1 and R2 may be placed on the first transfer hand 242. The first transfer robot 240 and the ring carrier 60 supporting the ring member R1 and R2 may be defined as a transfer assembly for transferring the ring member R1 and R2 between the second container F2, the atmospheric pressure transfer module 20, and the load lock chamber 40 to be described later. FIG. 2 schematically illustrates a first transfer hand of FIG. 1.

Referring to FIG. 2, at least one substrate support pad 244 may be provided on a top surface of the first transfer hand 242. For example, three substrate support pads 244 may be provided to support the substrate placed on the first transfer hand 242 at three points. The substrate support pad 244 may prevent the substrate W or the ring member R1 and R2 placed on the first transfer hand 242 from slipping. The substrate support pads 244 may be arranged along a circumferential direction of a virtual circle having a radius when viewed from above. The substrate support pad 244 may be provided in a substantially disk shape. A vacuum adsorption hole (not shown) may be formed within the substrate support pad 244. The substrate support pad 244 may vacuum-adsorb the substrate W or the ring member R1 and R2.

Referring back to FIG. 1, the vacuum transfer module 30 may be disposed between a load lock chamber 40 to be described later and a process chamber 50 to be described later. The vacuum transfer module 30 may include a transfer chamber 320 and a second transfer robot 340.

The transfer chamber 320 may maintain an inner atmosphere as a vacuum pressure atmosphere. The transfer chamber 320 may be provided with a second transfer robot 340. In an embodiment, the second transfer robot 340 may be located in a central area of the transfer chamber 320. The second transfer robot 340 may selectively transfer the substrate W or the ring member R1 and R2 between the load lock chamber 40 and the process chamber 50. Also, the vacuum transfer module 30 may transfer the substrate W between the process chambers 50. The second transfer robot 340 may move in a horizontal or vertical direction. The second transfer robot 340 may have a second transfer hand 342 that moves forwardly, backwardly, or rotates on a horizontal plane. At least one second transfer hand 342 of the second transfer robot 340 may be provided.

Figure 3:
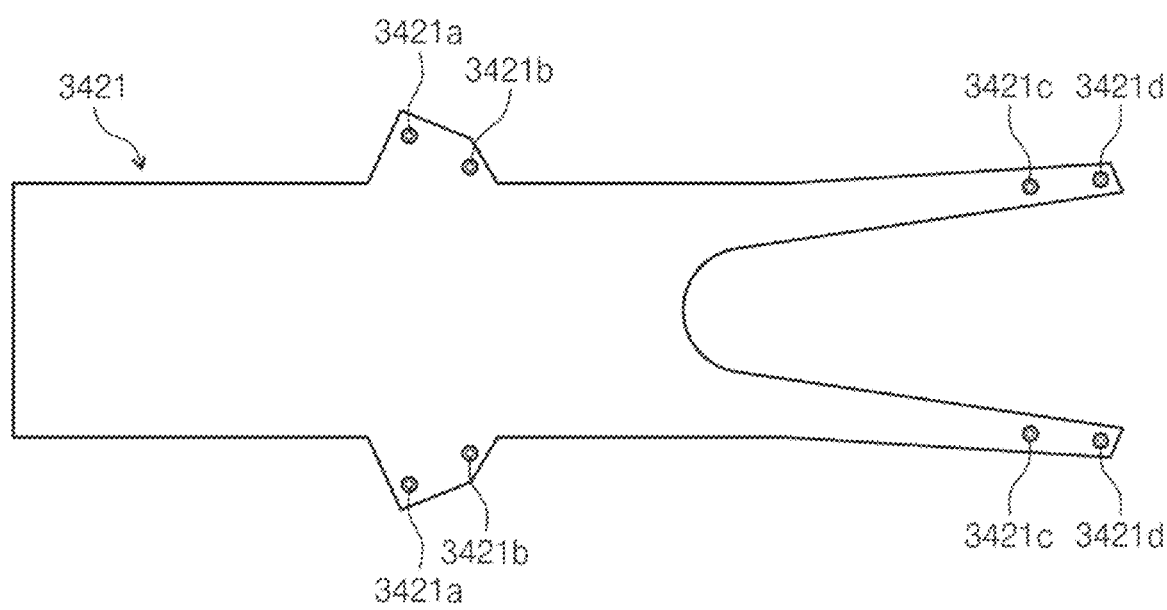
FIG. 3 schematically illustrates a first ring transfer hand of FIG. 1.
Figure 4:
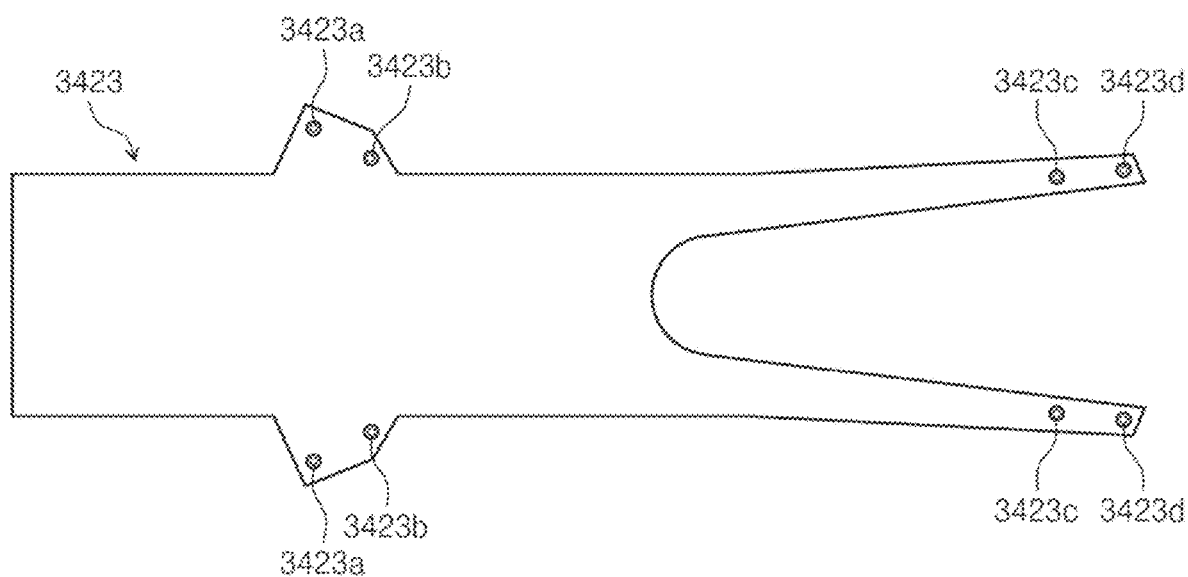
FIG. 4 schematically illustrates a second ring transfer hand of FIG. 1.

FIG. 3 to FIG. 4 each illustrate a state of the second transfer hand of FIG. 1. Referring to FIG. 3 to FIG. 4, the second transfer hand 342 may have a size relatively larger than that of the first transfer hand 242 (refer to FIG. 2). The second transfer hand 342 is provided to transfer any one of the substrate W or the ring member R1 and R2.

In an embodiment, the second transfer hand 342 has the first ring transfer hand 3421 illustrated in FIG. 3 and the second ring transfer hand 3423 illustrated in FIG. 4. The first ring transfer hand 3421 is provided to transfer the first ring R1 (refer to FIG. 7) to be described later, and the second ring transfer hand 3423 is provided to transfer the second ring R2 (refer to FIG. 8) to be described later. In an embodiment, the first ring transfer hand 3421 and the second transfer hand 3423 may be connected via a rotation shaft. The first ring transfer hand 3421 and the second transfer hand 3423 may be rotated with respect to a rotation axis. In an embodiment, the second ring R2 has an outer diameter and an inner diameter larger than that of the first ring R1.

A pair of first transfer pads 3421a, a pair of second transfer pads 3421b, a pair of third transfer pads 3421c, and a pair of fourth transfer pads 3421d may be provided on a top surface of the first ring transfer hand 3421. The second transfer pad 3421b and the third transfer pad 3421c may be disposed between the first transfer pad 3421a and the fourth transfer pad 3421d. When viewed from above, the second transfer pad 3421b and the third transfer pad 3421c may be disposed inside an outer circumference of the substrate W. Accordingly, the second transfer pad 3421b and the third transfer pad 3421c may support the substrate W. When viewed from above, the first transfer pad 3421a and the fourth transfer pad 3421d may be disposed outside the outer circumference of the substrate W and an inner circumference of the first ring member R1, but may be disposed inside a circumference of the ring member R1. Accordingly, the first transfer pad 3421a and the fourth transfer pad 3421d may support the first ring R1.

A pair of first transfer pads 3423a, a pair of second transfer pads 3423b, a pair of third transfer pads 3423c, and a pair of fourth transfer pads 3423d may be provided on a top surface of the second ring transfer hand 3423. The second transfer pad 3423b and the third transfer pad 3423c may be disposed between the first transfer pad 3423a and the fourth transfer pad 3423d. The second transfer pad 3423b and the third transfer pad 3423c may be disposed inside the outer circumference of the substrate W when viewed from above. Accordingly, the second transfer pad 3423b and the third transfer pad 3423c may support the substrate W. The first transfer pad 3423a and the fourth transfer pad 3423d may be disposed outside the outer circumference of the substrate W and the inner circumference of the second ring R2 when viewed from above, but may be disposed inside the outer circumference of the second ring R2. Accordingly, the first transfer pad 3423a and the fourth transfer pad 3423d may support the second ring R2.

In the above example, the second transfer hand 342 has the first ring transfer hand 3421 shown in FIG. 3 and the second ring transfer hand 3423 shown in FIG. 4, but in contrast, a pair of first transfer pads 3423a, a pair of second transfer pads 3234b, a pair of third transfer pads 3423c, and a pair of fourth transfer pads 3423d of FIG. 4 may be provided additionally to the first ring transfer hand 3421 of FIG. 3

Referring back to FIG. 1, at least one process chamber 50 may be connected to the transfer chamber 320. The transfer chamber 320 may be provided in a polygonal shape. A load lock chamber 40 and a process chamber 50 may be disposed around the transfer chamber 320. For example, a hexagonal shaped transfer chamber 320 may be disposed at a central area of the vacuum transfer module 30, and a load lock chamber 40 and a process chamber 50 may be disposed around the transfer chamber 320. However, a shape of the transfer chamber 320 and the number of process chambers may be variously modified and provided according to the needs of a user.

The load lock chamber 40 may be disposed between the transfer frame 220 and the transfer chamber 320. The load lock chamber 40 provides a buffer space in which the substrate W or the ring member R1 and R2 is exchanged between the transfer frame 220 and the transfer chamber 320. In an embodiment, to replace the ring member R disposed at the process chamber 50, the ring member R1 and R2 used at the process chamber 50 may temporarily remain at the load lock chamber 40. In an embodiment, in order to transfer a new ring member R1 and R2 scheduled to replace an old ring member R1 and R2 to the process chamber 50, the new ring member R1 and R2 may temporarily remain at the load lock chamber 40.

As mentioned above, an inner atmosphere of the transfer frame 220 may be maintained in an atmospheric pressure atmosphere, and the inner atmosphere of the transfer chamber 320 may be maintained in a vacuum pressure atmosphere. The load lock chamber 40 is disposed between the transfer frame 220 and the transfer chamber 320, so that an inner atmosphere thereof may be converted between the atmospheric pressure atmosphere and a vacuum pressure atmosphere.

Figure 5:
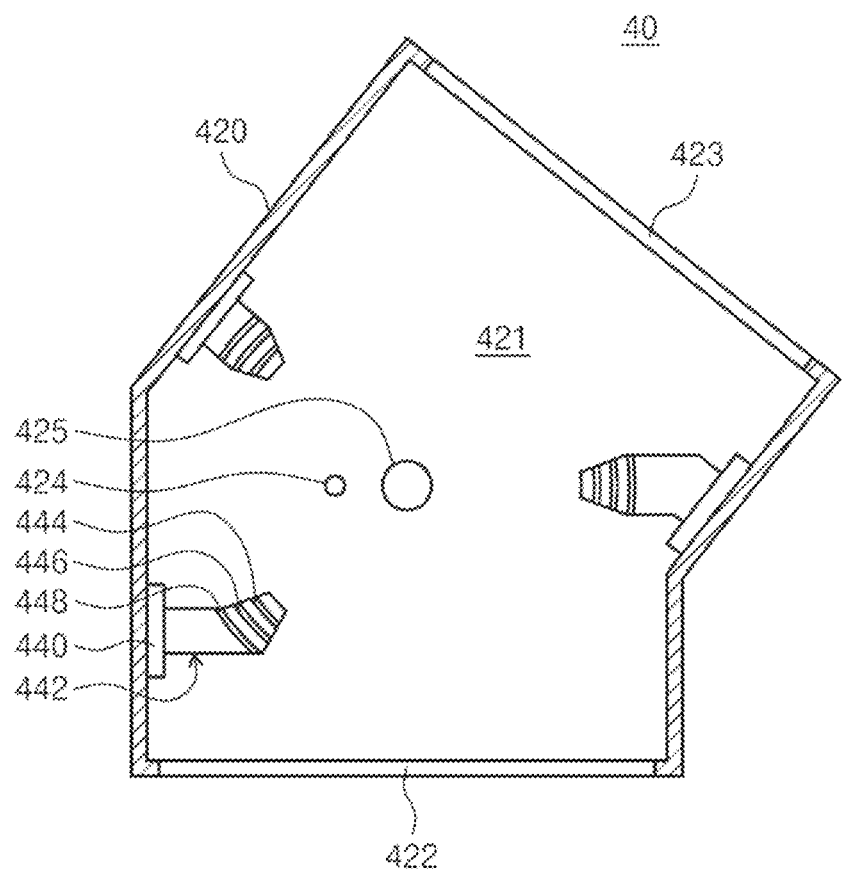
FIG. 5 is a plan cross-sectional view illustrating a load lock chamber of FIG. 1.
Figure 6:
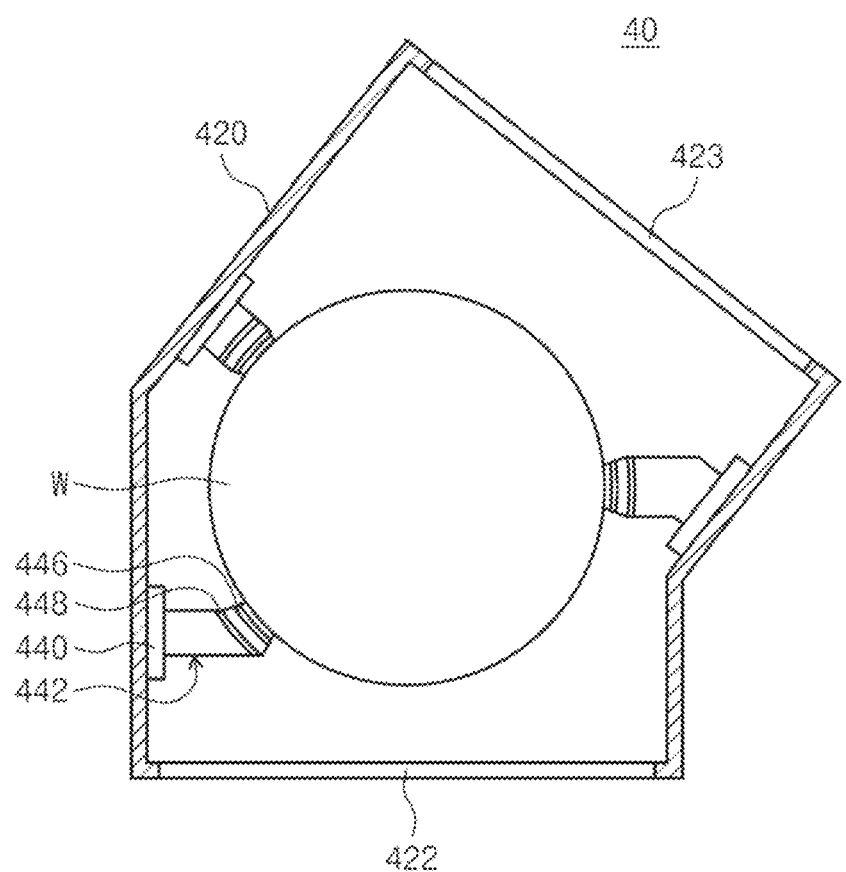
FIG. 6 illustrates a state in which a substrate is placed on a support shelf of FIG. 5.
Figure 7:
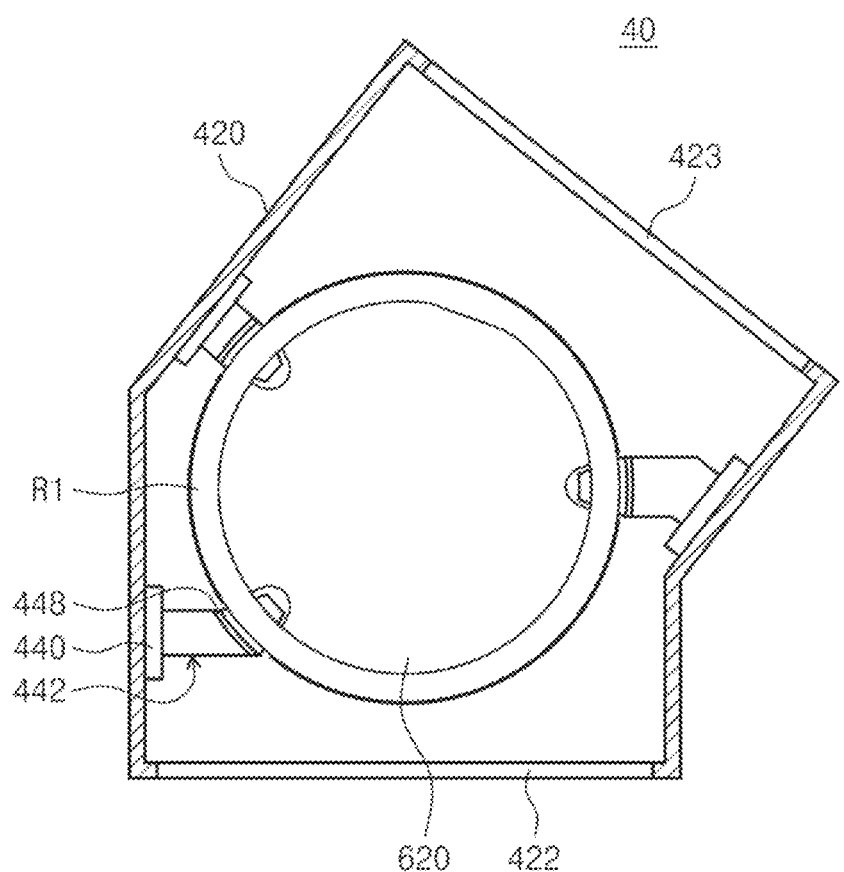
FIG. 7 illustrates a state in which a first ring is placed on the support shelf of FIG. 5.
Figure 8:
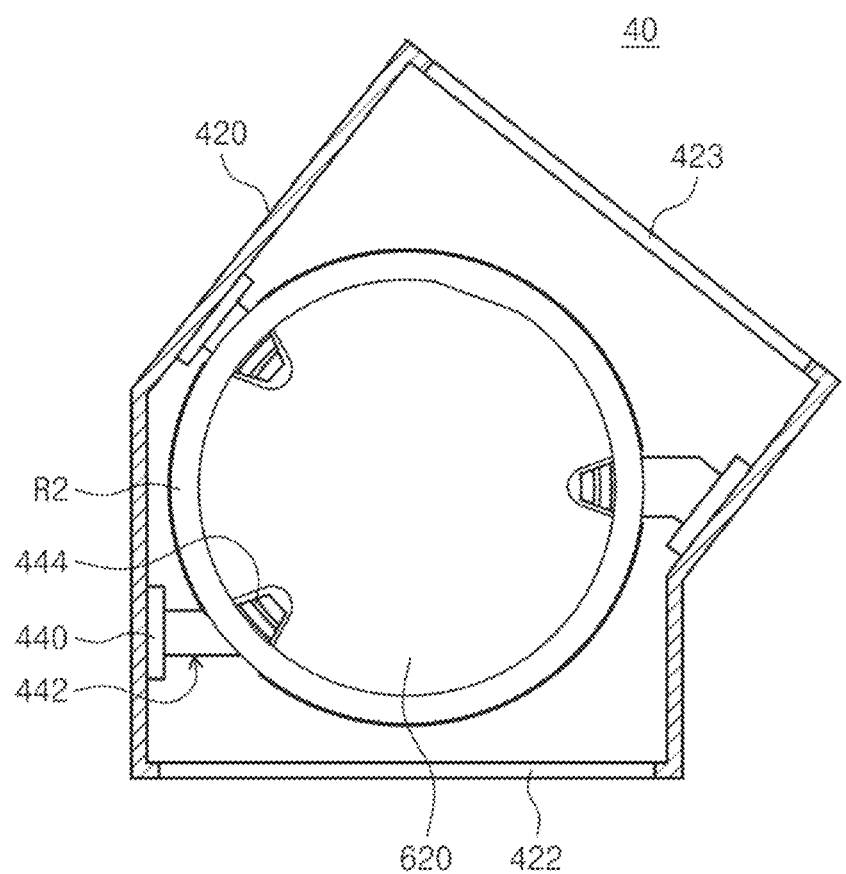
FIG. 8 illustrates a state in which a second ring is placed on the support shelf of FIG. 5.
Figure 9:
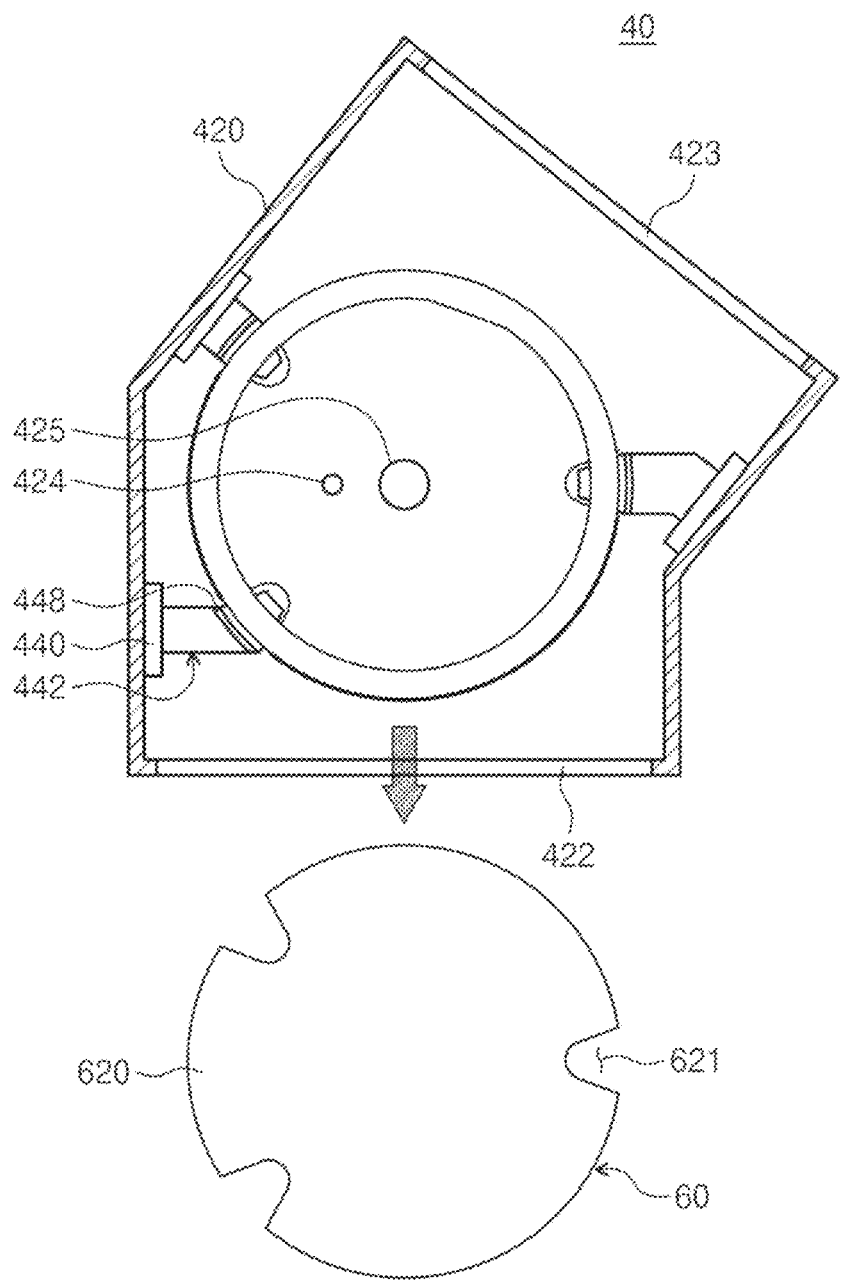
FIG. 9 illustrates a ring carrier which is taken out of the support shelf to the load lock chamber of FIG. 5.

FIG. 5 is a plan cross-sectional view illustrating a state of a load lock chamber of FIG. 1. FIG. 6 illustrates a state in which a substrate is placed on a support shelf of FIG. 5. FIG. 7 illustrates a state in which a first ring is placed on the support shelf of FIG. 5. FIG. 8 illustrates a state in which a second ring is placed on the support shelf of FIG. 5. FIG. 9 illustrates the ring carrier being taken out of the support shelf to the load lock chamber of FIG. 5.

Referring to FIG. 1 and FIG. 5 to FIG. 9, the load lock chamber 40 may include a housing 420 and a support shelf 440. The housing 420 may have a buffer space 421 in which the substrate W or the ring member R1 and R2 is placed. In addition, a first opening 422 and a second opening 423 may be formed at the housing 420. The first opening 422 may be provided on a surface facing the transfer frame 220 and may be opened and closed by a gate valve (not shown). The second opening 423 may be provided on a surface facing the transfer chamber 320 and may be opened and closed by a gate valve (not shown).

A gas supply hole 424 for supplying a gas to the buffer space 421 of the housing 420 may be formed at the housing 420. The gas according to an embodiment of the inventive concept may be an inert gas. For example, the gas may be a gas including a nitrogen, an argon, or the like. However, the inventive concept is not limited thereto, and the gas may be variously modified and provided as a known inert gas which may purge the buffer space 421.

A depressurizing hole 425 for providing a negative pressure to the buffer space 421 of the housing 420 may be formed at the housing 420. The depressurizing hole 425 may be connected to a depressurizing member (not shown). The depressurizing member may be a pump. However, the inventive concept is not limited thereto, and the depressurizing member may be variously modified to a known device for providing the negative pressure to the buffer space 421.

A pressure of the buffer space 421 may be switched between an atmospheric pressure and a vacuum pressure by the gas supply hole 424 and the depressurizing hole 425.

A support shelf 440 may be provided at the buffer space 421. The support shelf 440 may support the substrate W or the ring member R at the buffer space 421. At least one support shelf 440 may be provided. Selectively, a plurality of support shelves 440 may be provided. For example, three support shelves 440 may be provided. A plurality of support shelves 440 may be provided to be spaced apart from each other when viewed from above. The plurality of support shelves 440 may be vertically spaced apart from each other. For this reason, the substrate W or the ring member R1 and R2 may be supported in multiple layers at the buffer space 421.

Each of the support shelves 440 may include a support protrusion 442. When viewed from above, the support protrusion 442 may be disposed at a position aligned with a notch 621 formed at the ring carrier 60 to be described later. When viewed from its cross section, the support protrusion 442 may have an upside down "L" shape. The support protrusion 442 may include a first shelf pad 444, a second shelf pad 446, and a third shelf pad 448.

The first shelf pad 444, the second shelf pad 446, and the third shelf pad 448 may be made of a material having a friction with respect to the substrate W or the ring member R1 and R2. For example, the first shelf pad 444, the second shelf pad 446, and the third shelf pad 448 may be made of a material such as a carbon-filled poly-ether-ether-ketone (PEEK). However, this is only one embodiment, and may be variously modified to other known materials having similar properties.

When viewed from above, the first shelf pad 444 may have an arc shape in its lengthwise direction. The first shelf pad 444 may be disposed closer to the depressurizing hole 425 than the second shelf pad 446. When viewed from above, the first shelf pad 444 may be disposed inside an outer circumference of the substrate W. Accordingly, as shown in FIG. 6, the first shelf pad 444 may support the substrate W among the substrate W and the ring member R1 and R2.

When viewed from above, the second shelf pad 446 may generally have an arc shape in its lengthwise direction. The second shelf pad 446 may be disposed away from the depressurizing hole 425 than the first shelf pad 444. When viewed from above, the second shelf pad 446 may be disposed outside the outer circumference of the substrate W and an inner circumference of the first ring R1, but may be disposed inside an outer circumference of the first ring R1. Accordingly, the second shelf pad 446 may support the first ring R1 as is illustrated in FIG. 7.

When viewed from above, the third shelf pad 448 may have an arc shape in its lengthwise direction. The third shelf pad 448 may be disposed farther from the depressurizing hole 425 than the second shelf pad 446. When viewed from above, the third shelf pad 448 may be disposed outside the inner circumference of the second ring R2, but may be disposed inside the outer circumference of the second ring R2. For this reason, as shown in FIG. 8, the third shelf pad 448 may support the second ring R2.

The ring carrier 60 has a plate 620 and a notch 621. The ring carrier 60 may be used to transfer the ring member R1 and R2. The ring carrier 60 may be used to transfer the ring member R1 and R2 by the first transfer robot 240 or the second transfer robot 340. For example, the ring carrier 60 may be used by the first transfer robot 240 to transfer the ring member R1 and R2 between the atmospheric pressure transfer module 20 and the load lock chamber 40. Hereinafter, a case in which the ring member R1 and R2 is transferred by the first transfer robot 240 will be described as an example. The ring carrier 60 may be stored in the container F. For example, the ring carrier 60 may be stored in the second container F2. In this case, the ring carrier 60 may be stored below the ring member R1 and R2 stored in the second container F2.

The ring member R1 and R2 may be placed on a top surface of the plate 620. The plate 620 may have a plate shape. The plate 620 may have a circular plate shape. For example, the plate 620 has a diameter larger than a diameter of the ring member R1 and R2. Since the plate 620 is provided in the circular plate shape, the ring member R1 and R2 may be stably supported on the plate 620 and transferred. A central region of the plate 620 may be provided as a blocking plate having no holes formed therein. Selectively, a through hole for reducing a weight of the plate 620 may be formed in the central region of the plate 620.

A plurality of notches 621 may be formed in an edge region of the plate 620. The plurality of notches 621 may be provided in the edge region of the plate 620. The notch 621 is formed to penetrate from the top surface to the bottom surface of the plate 620. The notch 621 may be formed in the edge region of the plate 620, and may be formed in the edge region including an outer circumference of the plate 620. That is, the notch 621 may be formed to extend from the edge region of the plate 620 to the outer circumference of the plate 620. The notches 621 may be formed at positions aligned with the support shelves 440 provided in the load lock chamber 40 when viewed from above. In addition, the notches 621 may be formed at positions overlapping the support slots (not shown) provided in the second container F2 when viewed from above. This prevents the ring carrier 60 from interfering with the support shelf 440 or/and the support slots (not shown) when transferring the ring member R1 and R2 using the ring carrier 60.

When viewed from above, a plurality of support protrusions 442 are disposed at positions aligned with a plurality of notches 621 formed at the ring carrier 60. Accordingly, the ring carrier 60 with the ring member R1 and R2 placed thereon may be introduced into a higher position than the support protrusion 442 within the load lock chamber 40 by the first transfer hand 242, and when the first transfer hand 242 downwardly moves, the ring member R1 and R2 may be placed on the support protrusion 442, and the ring carrier 60 may be downwardly moved with the first transfer hand 242 placed thereon.

Referring back to FIG. 1, a plurality of process chambers 50 may be provided. The process chamber 50 may be a chamber that performs a process on the substrate W. The process chamber 50 may be a plasma chamber that treats the substrate W using a plasma. For example, the process chamber 50 may be a chamber performing an etching process of removing a thin film on the substrate W using the plasma, an ashing process of removing a photoresist film, a deposition process of forming a thin film on the substrate W, or a dry cleaning process. However, the inventive concept is not limited thereto, and a plasma treatment process performed at the process chamber 50 may include various known processes for treating the substrate using a plasma.

Figure 10:
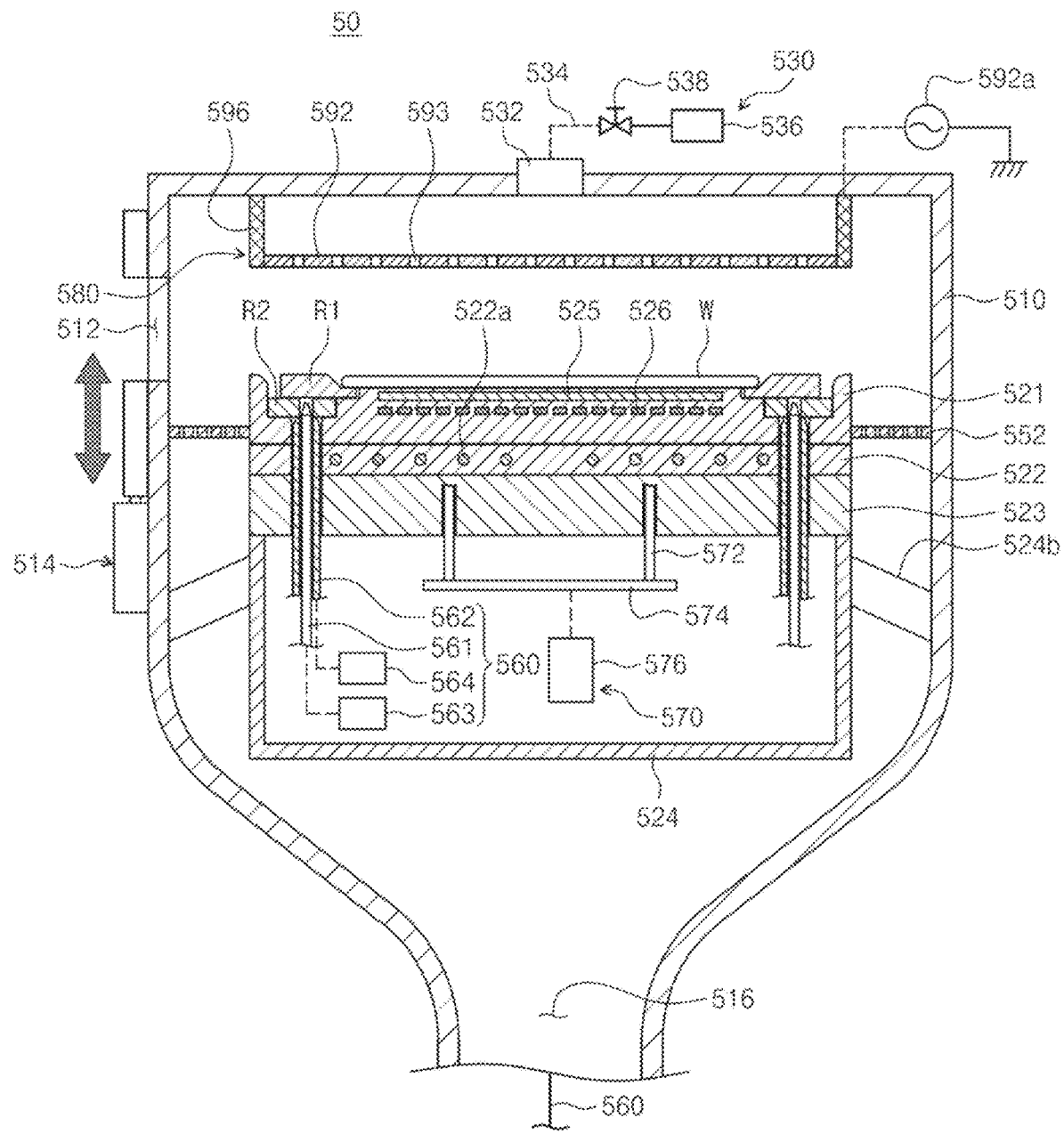
FIG. 10 schematically illustrates an embodiment of a process chamber of FIG. 1.

FIG. 10 schematically illustrates an embodiment of a process chamber of FIG. 1. Referring to FIG. 10, the process chamber 50 may treat a substrate W by transferring a plasma to the substrate W.

The process chamber 50 may include a housing 510, a substrate support unit 520, a gas supply unit 530, and a plasma source.

The housing 510 provides a treating space in which a substrate treating space is performed. The housing 510 may be provided in a sealed shape. When treating the substrate W, the treating space of the housing 510 may be generally maintained in a vacuum atmosphere. The housing 510 may be formed of a metal material. In an embodiment, the housing 510 may be made of an aluminum material. The housing 510 may be grounded. The substrate W and an inlet 512 through which a ring member R1 and R2 is carried in or out may be formed on a side of the housing 510. The inlet 512 may be selectively opened and closed by a gate valve 514.

An exhaust hole 516 may be formed at the bottom surface of the housing 510. An exhaust line 560 may be connected to the exhaust hole 516. The exhaust line 570 may exhaust a process gas, process by-products, and the like supplied to the treating space of the housing 510 through the exhaust hole 516. An exhaust baffle 552 may be provided above the exhaust hole 516 to allow a more uniform exhaust of the treating space. When viewed from above, the exhaust baffle 552 may have a generally ring shape. In addition, at least one through hole may be formed at the exhaust baffle 552.

The substrate support unit 520 supports the substrate within the housing 510. The substrate support unit 520 may be spaced apart from a bottom surface of the housing 510 to a top side. The substrate support unit 520 is described in detail further on.

The gas supply unit 530 supplies the process gas to the treating space of the housing 510. The gas supply unit 530 may include a gas supply nozzle 532, a gas supply line 534, and a gas supply source 536. In an embodiment, the gas supply nozzle 532 may be installed in a center of a top surface of the housing 510. An injection hole is formed on a bottom surface of the gas supply nozzle 532. The injection port supplies the process gas into the housing 510. The gas supply line 534 connects the gas supply nozzle 532 and the gas supply source 536. The gas supply line 534 supplies the process gas stored in the gas supply source 536 to the gas supply nozzle 532. A valve 538 is installed in the gas supply line 534. The valve 538 may open and close the gas supply line 534 to adjust a flow rate of the process gas supplied within the gas supply line 534. According to an embodiment, the valve 538 may be a open/close valve and/or a flow adjust valve.

The process chamber 50 may be provided in a capacitive coupled plasma (CCP) apparatus or an inductively coupled plasma (ICP) apparatus. Hereinafter, a case in which the process chamber 50 is provided as the capacitive coupling type plasma apparatus will be described. However, unlike this, the process chamber 50 may be provided as the inductively coupled plasma (ICP) apparatus.

The process chamber 50 has a top electrode and a bottom electrode as a plasma source. According to an embodiment, the top electrode may be a shower head unit 580 to be described later, and the bottom electrode may be provided as a cooling plate 522. The top electrode and the bottom electrode may be vertically disposed in parallel with each other inside the housing 510. One of both electrodes may apply a high-frequency power, and the other electrode may be grounded. An electromagnetic field is formed in the space between both electrodes, and the process gas supplied to the space may be excited in a plasma state. A substrate treating process is performed using the plasma. The high-frequency power may be applied to the bottom electrode, and the top electrode may be grounded. Alternatively, the high-frequency power may be applied to the top electrode and the bottom electrode, respectively. Accordingly, the electromagnetic field is generated between the top electrode and the bottom electrode. The generated electromagnetic field excites the process gas supplied into the housing 510 in the plasma state.

The shower head unit 580 may include a gas injection plate 592 and a support unit 596. A predetermined space may be formed between the gas injection plate 592 and the top surface of the housing 510. The gas injection plate 592 may be provided in a plate shape having a constant thickness. The bottom surface of the gas injection plate 592 may be anodized to prevent a generation of an arc caused by the plasma. A cross section of the gas injection plate 592 may be provided to have the same shape as that of the substrate support unit 520. The gas injection plate 592 includes a plurality of through holes 593. The gas injection plate 592 penetrates the top and bottom surfaces of the shower head 592 in a vertical direction. The gas injection plate 592 may include a metal material. The gas injection plate 592 may be electrically connected to the power source 592a. The power source 592a may be provided as the high frequency power source. Alternatively, the gas injection plate 592 may be electrically grounded.

The support unit 596 supports a side portion of the gas injection plate 592. A top end of the support unit 596 is connected to the top surface of the housing 510, and a bottom end thereof is connected to a side portion of the shower head 592 and the gas injection plate 592. The support unit 596 may include a non-metallic material.

In an embodiment, the substrate support unit 520 may be provided as an electrostatic chuck that adsorbs the substrate W using an electrostatic force. In contrast, the substrate support unit 520 may support the substrate W in various ways such as a vacuum adsorption or a mechanical clamping. Hereinafter, the substrate support unit 520 as the electrostatic chuck will be described.

In an embodiment, the substrate support unit 520 may include a support plate 521, a cooling plate 522, an insulation plate 523, a base 524, a ring lift pin assembly 560, and a substrate lift pin assembly 570.

Hereinafter, the support plate 521 may be provided as a dielectric plate 521. The dielectric plate 521 is located at the top portion of the substrate support unit 520. The dielectric plate 521 receives an external power and applies the electrostatic force to the substrate W. The dielectric plate 521 may be provided as a disk-shaped dielectric substance. The substrate W is placed on a top surface of the dielectric plate 521. In an embodiment, the top surface of the dielectric plate 521 has a smaller radius than that of the substrate W. If the substrate W is placed on the top surface of the dielectric plate 521, an edge area of the substrate W is located outside the dielectric plate 521. An electrode 525 and a heater 526 are buried within the dielectric plate 521. In an embodiment, the electrode 525 may be positioned above the heater 526. The electrode 525 may be electrically connected to a power source (not shown). The power source (not shown) may include a direct current power source. An electrostatic force acts between the electrode 525 and the substrate W by a current applied to the electrode 525. Accordingly, the substrate W is adsorbed on the dielectric plate 521.

A generated heat generated by the heater 526 is transferred to the substrate W through the dielectric plate 521. The substrate W may be maintained at a predetermined temperature by the heat generated from the heater 526. The heater 526 may include a spiral coil. A plurality of heaters 526 are provided. The heater 526 may be provided in different regions of the dielectric plate 521. For example, a heater 526 for heating a central region of the dielectric plate 521 and a heater 526 for heating an edge region of the dielectric plate 521 may be provided, and the heaters 526 may be independently controlled from each other.

In the above-described example, the heater 526 is provided within the dielectric plate 521, but the inventive concept is not limited thereto, and the heater 526 may not be provided within the dielectric plate 521.

The cooling plate 522 is located under the dielectric plate 521. The cooling plate 522 may be provided in a disk shape. The cooling plate 522 may be made of a conductive material. In an embodiment, the cooling plate 522 may be made of an aluminum material. A top central region of the cooling plate 522 may have an area corresponding to a bottom surface of the dielectric plate 521. A flow path 522a may be provided within the cooling plate 522. The flow path 522a may be formed in a spiral shape within the cooling plate 522. The flow path 522a may cool the cooling plate 522. A cooling fluid may be supplied to the flow path 522a. In an embodiment, the cooling fluid may be provided as a cooling water.

The cooling plate 522 may include a metal plate. According to an embodiment, an entire area of the cooling plate 522 may be provided as a metal plate. The cooling plate 522 may be grounded. Therefore, the cooling plate 522 may function as an electrode opposite the shower head unit 580 mentioned above. However, it may be limited as such, and the cooling plate 522 may be being electrically connected to the electrode which is not shown to be applied with a high frequency power.

An insulating plate 523 is provided under the cooling plate 522. The insulating plate 523 is made of an insulating material, and electrically insulates the cooling plate 522 from a base 524 to be described later. The insulating plate 523 may be provided in a circular plate shape when viewed from above. The insulating plate 523 may be provided with an area corresponding to that of the cooling plate 522.

The base 524 is provided at a bottom side of the cooling plate 522. The base 524 may be provided at a bottom side of the insulating plate 523. The base 524 may have an inner space and have a cylinder shape with an open top portion. A ring lift pin assembly 560 and a substrate lift pin assembly 570 to be described later may be positioned within an inner space of the base 524.

The base 524 has a connecting member 524b. The connecting member 524b connects an outer surface of the base 524 with an inner sidewall of the housing 510. A plurality of connecting members 524b may be provided on the outer surface of the base 524 at regular intervals. The connecting member 524b supports the substrate support unit 520 within the housing 510.

The ring member R1 and R2 and the cover ring 521 are disposed in an edge region of the substrate support unit 520. The ring member R1 and R2 has an annular shape when viewed from above. The ring member R1 and R2 serves to concentrate the plasma on the substrate W while treating the substrate W. In an embodiment, the ring member R1 and R2 may be formed of a conductive material. In an embodiment, the material of the ring member R1 and R2 may be provided as a silicon (Si), a silicon carbide (SiC), or the like.

In an embodiment, the ring member R1 and R2 includes a first ring R1 and a second ring R2. The first ring R1 has an inner diameter and an outer diameter smaller than that of the second ring R2. The second ring R2 is provided below the first ring R1. On the substrate support unit 520, the bottom surface of the first ring R1 and the top surface of the second ring R2 are placed in contact with each other. In an embodiment, when viewed from above, a portion of the second ring R2 is provided to overlap the first ring R1.

In an embodiment, the first ring R1 may have a form in which a height of an inner top surface is lower than a height of an outer top surface. A bottom surface of an edge region of the substrate W may be placed on the inner top surface of the first ring R1. In addition, the first ring R may have an upwardly inclined surface from the center of the substrate W toward an outside of the substrate W between the inner top surface and the outer top surface of the first ring R1. Accordingly, if the substrate W is placed on the inner top surface of the first ring R1, the substrate W may slide along an inclined surface of the first ring R1 to be appropriately placed on the inner top surface of the first ring R, even if a placement position may be slightly inaccurate.

The ring lift pin assembly 560 may lift and lower the ring member R1 and R2 placed on the top surface of the dielectric plate 521.

The ring lift pin assembly 560 includes a first pin 561, a second pin 562, and a driving unit 563 and 564. The first pin 561 lifts and lowers the first ring R1, and the second pin 562 lifts and lowers the second ring R2. The driving unit 563 and 564 drives the first pin 561 and the second pin 562. In an embodiment, the driving unit 563 and 564 may include a first driving mechanism 563 and a second driving mechanism 564. The first driving mechanism moves the first pin 561 in an up/down direction, the second driving mechanism moves the second pin in the up/down direction. Selectively, the driving unit 563 and 564 may be a single driving apparatus which moves the first pin 561 and the second pin 562 separately in the up/down direction. The driving unit 563 and 564 may be a cylinder or a motor using a pneumatic or a hydraulic pressure. However, the inventive concept is not limited thereto, and the driving unit 563 may be provided as various known devices capable of providing a driving force.

The first pin 561 and the second pin 562 are provided inside the substrate support unit 520. In an embodiment, the first pin 561 and the second pin 562 are provided to be movable in the vertical direction along the pin holes formed in the dielectric plate 521, the cooling plate 522, and/or the insulating plate 523. In an embodiment, a plurality of first pins 561 and second pins 562 may be provided. For example, the first pin 561 and the second pin 562 may be provided to support the ring member R1 and R2 in three points. Selectively, the first pin 561 and the second pin 562 may be provided in a larger number. The first pin 561 and the second pin 562 may be disposed so as not to overlap the heater 526 and the flow path 522a when viewed from above.

The first ring R1 is provided in a pin shape, and the second ring R2 is provided in a hollow shaft shape having a through hole therein. The first ring R1 is provided inside the second pin 562 to be movable in the vertical direction. A through-hole is formed in the second ring R2. The first ring R1 is moved inside the second ring R2 and is provided to be inserted into the through hole formed in the second ring R2. When viewed from above, the through-hole and the first ring R1 are provided to overlap each other. Accordingly, the first pin 561 may lift and lower the first ring R1 disposed on the second ring R2.

Hereinafter, a method of transferring the ring member will be described with reference to FIG. 11 to FIG. 35.

Figure 11:
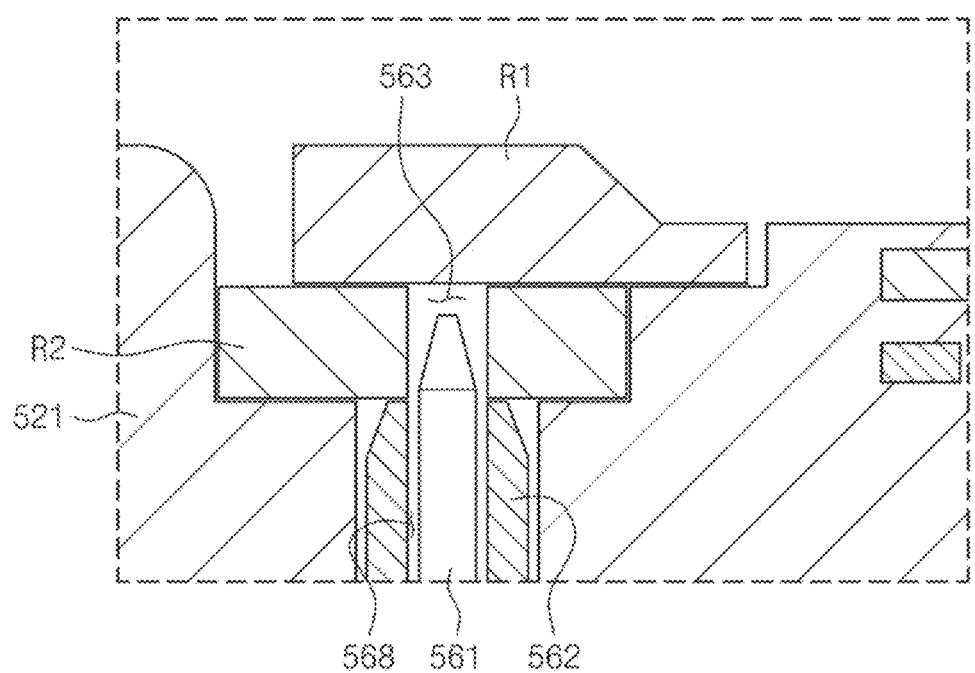
FIG. 11 to FIG. 35 each sequentially illustrate a ring member of an embodiment of the inventive concept being replaced.

FIG. 11 illustrates the first pin 561 and the second pin 562 while the substrate W is treated in the process chamber 50. In an embodiment, while the substrate W is treated, a top end of the first pin 561 may be positioned below a bottom surface of the first ring R1 as shown in FIG. 11.

The ring member R1 and R2 may be replaced after the substrate W is treated or before a subsequent substrate W is treated. In an embodiment, after the substrate W is treated, the ring member R1 and R2 is replaced before the subsequent substrate W is taken into the process chamber 50.

Figure 12:
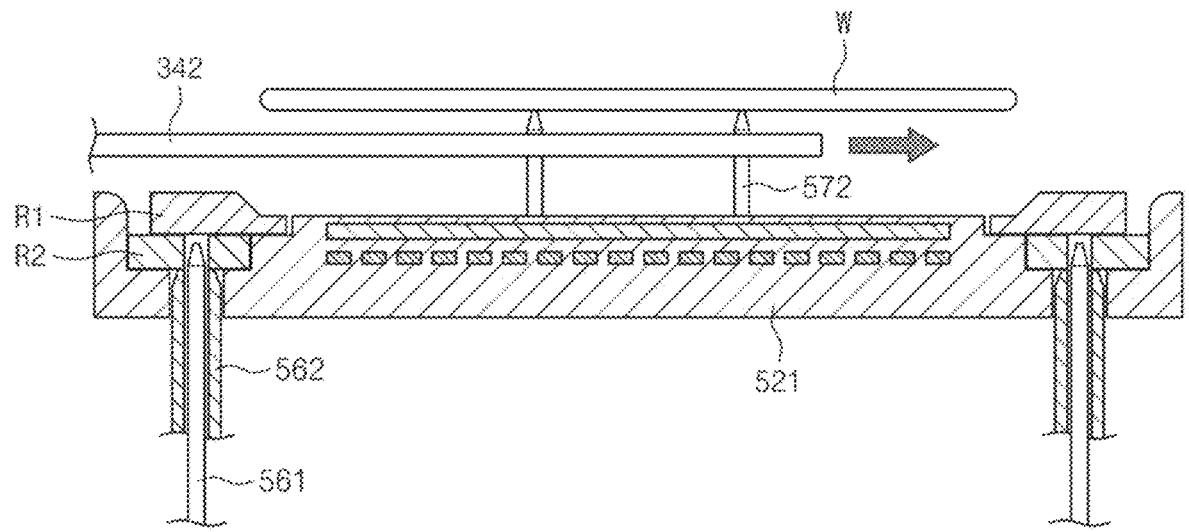
Figure 13:
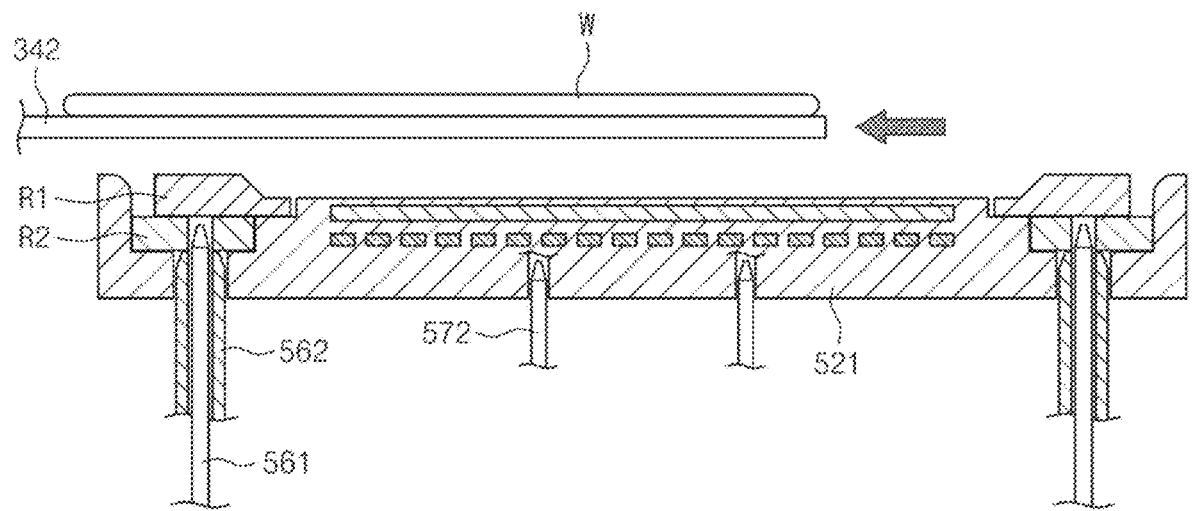

FIG. 12 to FIG. 13 illustrate a process in which the substrate W is transferred to the outside of the process chamber 50. After the substrate W is treated, as shown in FIG. 12, the lift pin 572 is lifted to lift and lower the substrate W from the dielectric plate 521, and the second transfer hand 342 enters the process chamber 50. The second transfer hand 342 is aligned at a position at which the substrate W may be seated on the second transfer hand 342. The second transfer hand 342 is aligned below the substrate W and lifts the substrate W from a bottom to a top.

The substrate W seated on the second transfer hand 342 is transferred to the outside of the process chamber 50 as shown in FIG. 13, and the lift pin 572 is lowered to be located inside the substrate support unit 520. The substrate W transferred by the second transfer hand 342 may be placed on the support shelf 440 as shown in FIG. 6. Thereafter, the substrate W may be transferred to the container F by the first transfer robot 242 of FIG. 2 and stored thereafter.

After the substrate W is removed from the substrate support unit 520, the ring member R1 and R2 is replaced. In an embodiment, of the ring member R1 and R2, the first ring R1 and the second ring R2 are sequentially transferred to the outside of the process chamber 50. Hereinafter, a case in which both the first ring R1 and the second ring R2 are replaced will be described as an example.

Figure 14:
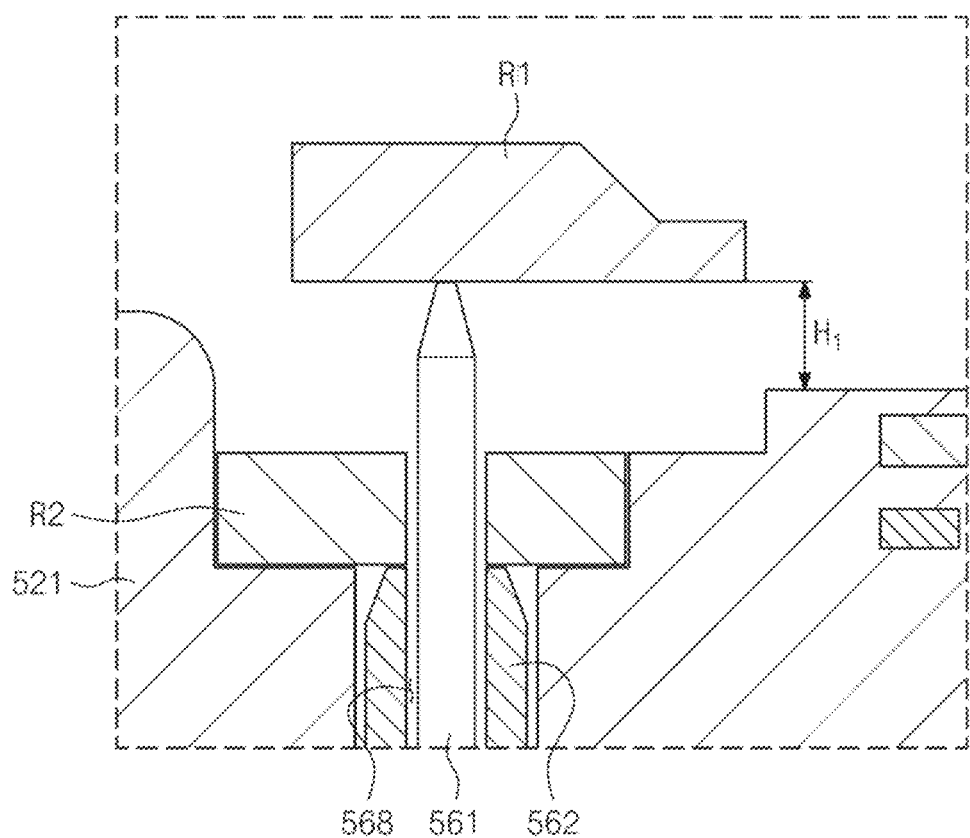
Figure 15:
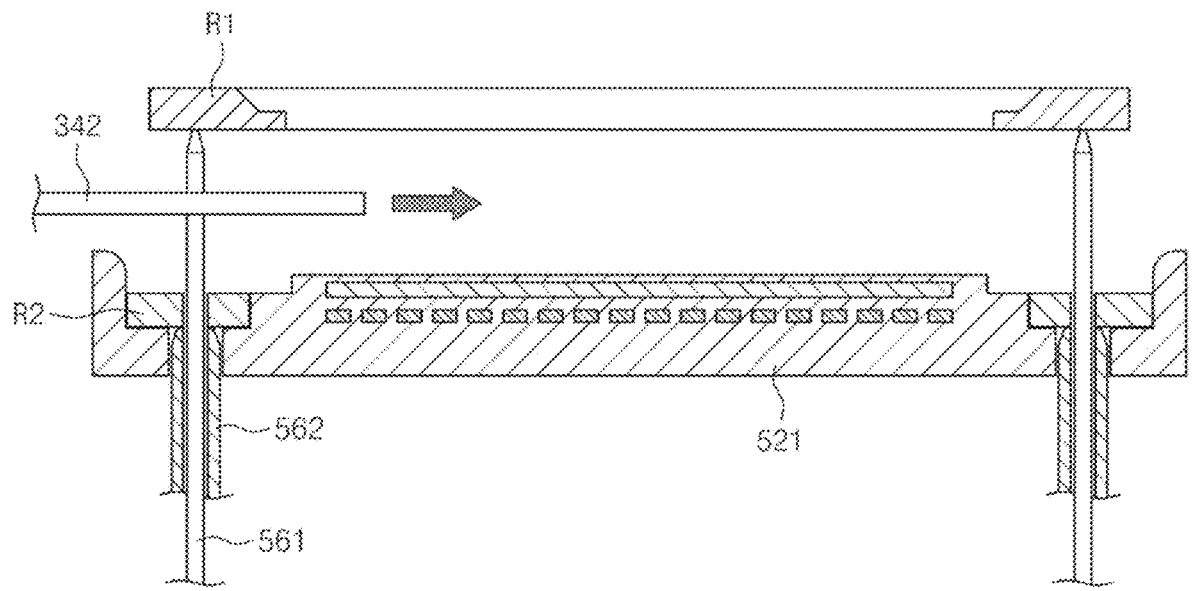

FIG. 14 to FIG. 15 illustrate a process for transferring the first ring R1 to the outside of the process chamber 50. First, the first pin 561 is positioned at a bottom side of the first ring R1. According to an embodiment, a top end of the first pin 561 is positioned at a bottom side of a bottom end of the first ring R1, while the treatment is performed with respect to the substrate W. Also, the top end of the first pin 561 may protrude from a top end of the second ring R2. Accordingly, while treating the substrate W, a portion of the first pin 561 may be inserted into the through hole formed on the second ring R2. However, it is not limited to this, and the top end of the first pin 561 may be positioned at the more bottom side than the second ring R2.

Figure 16:
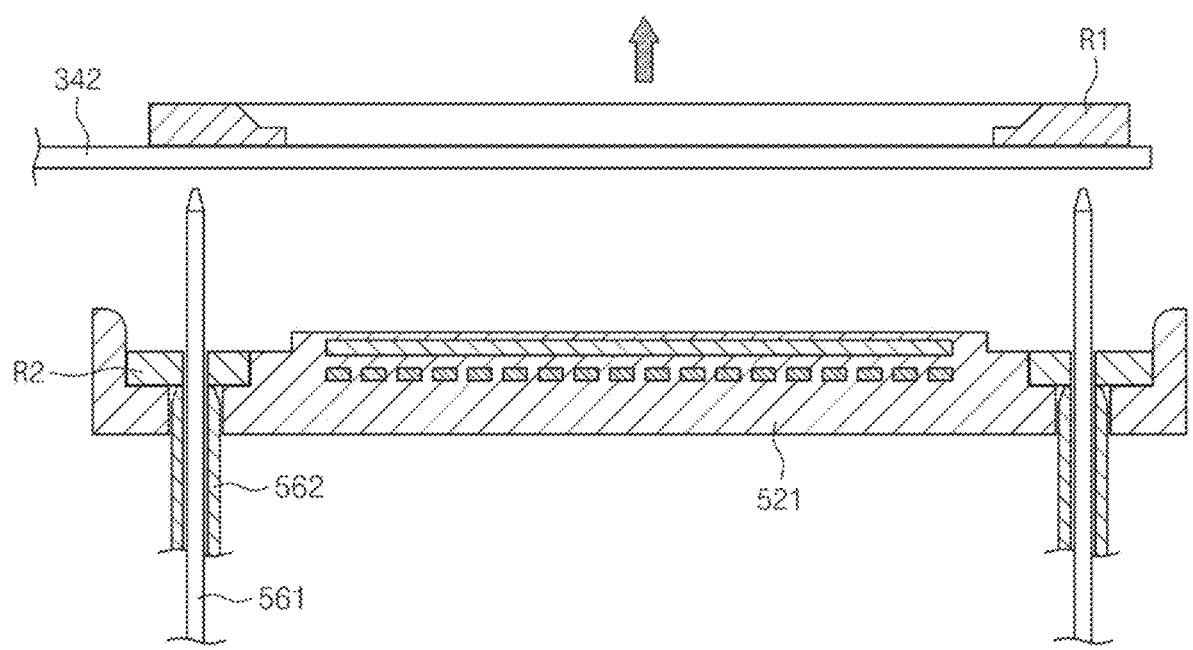

After the treatment has been completed on the substrate W, the first driving mechanism 563 (refer to FIG. 10) lifts and lowers the first pin 561 after the substrate is taken out from the process chamber 50. More specifically, the first driving mechanism may lift and lower the first pin 561 from a bottom side of the first ring R1. Therefore, the top end of the first pin 561 contacts the bottom surface of the first ring R1. As shown in FIG. 14, the first pin 561 lifts and lowers the first ring R1 from the top surface of the dielectric plate 521 to a position spaced apart in an upward direction. The first pin 561 may lift the first ring R1 from the top surface of the dielectric plate 521 to the a position spaced apart a certain distance in an upward direction. If the first pin 561 moves the first ring R1 to a position spaced apart a certain distance in the upward direction from the top surface of the dielectric plate 521, the second transfer hand 342 enters the process chamber 50 as shown in FIG. 15. Selectively, while the first pin 561 is lifted, the second transfer hand 342 may enter the process chamber 50. The second transfer hand 342 is aligned at a position at which the first ring R1 may be seated on the second transfer hand 342. The second transfer hand 342 is aligned below the first ring R1 and lifts the first ring R1 from a bottom to a top as shown in FIG. 16. Therefore, the second transfer hand 324 may receive the first ring R1 from the first pin 561.

Figure 17:
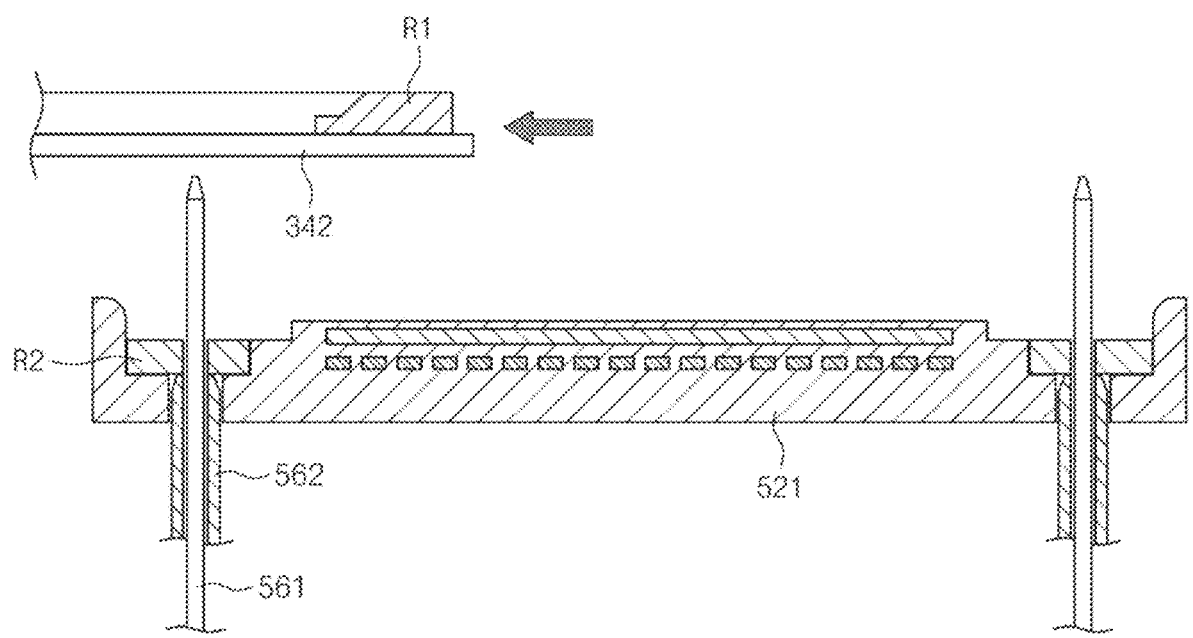

As illustrated in FIG. 17, if the first ring R1 is taken from the first pin 561 to the second transfer hand 342, the second transfer hand 342 may be transferred to an outside of the process chamber 50 and may be transferred to the second ring R2.

FIG. 18 to FIG. 21 illustrate a process for transferring the second ring R2 to an outside of the process chamber 50.

Figure 18:
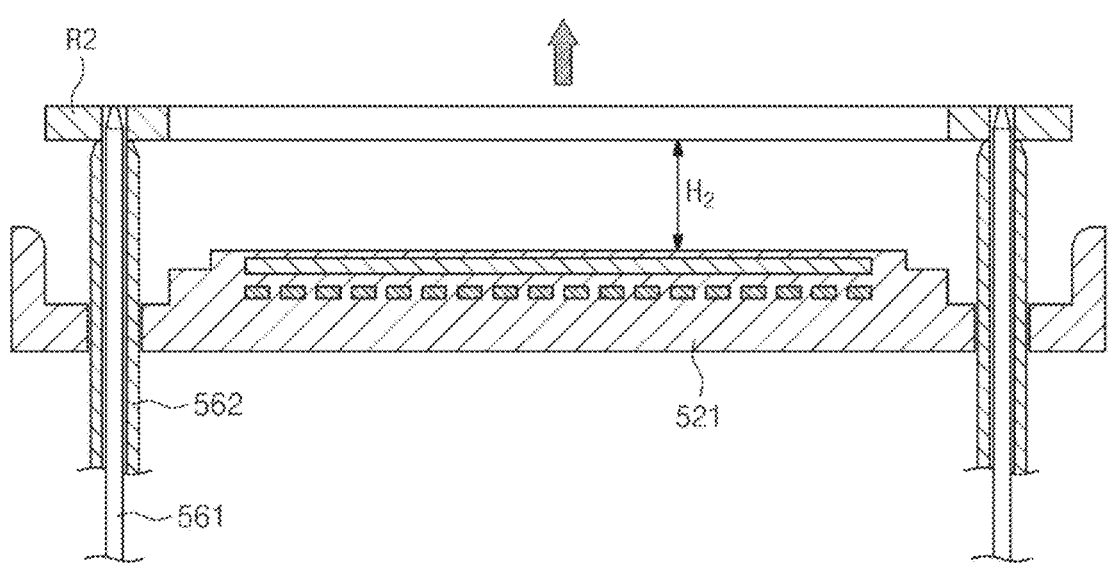
Figure 19:
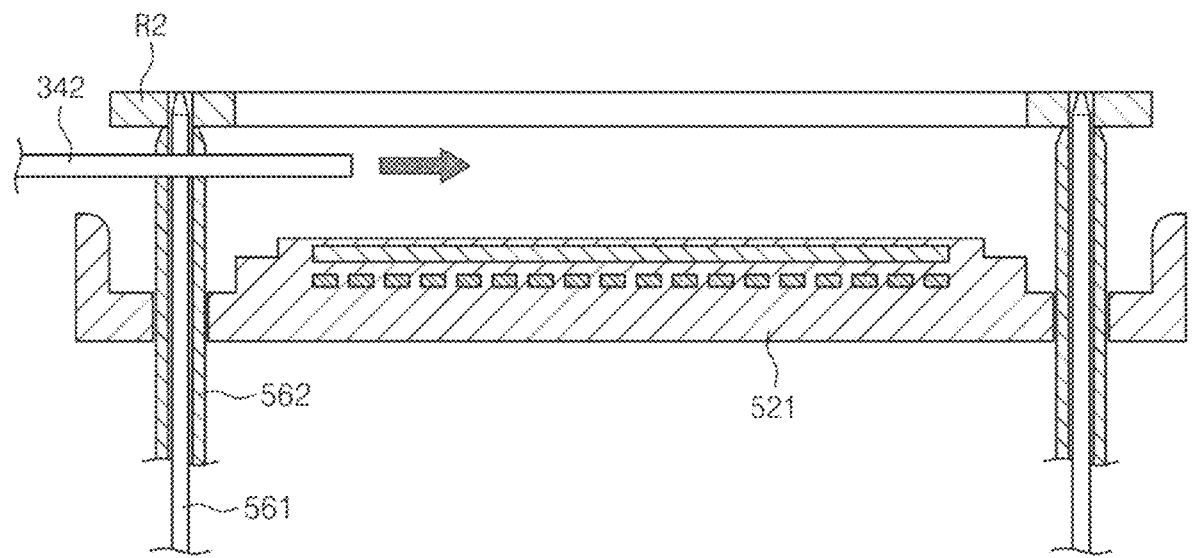
Figure 20:
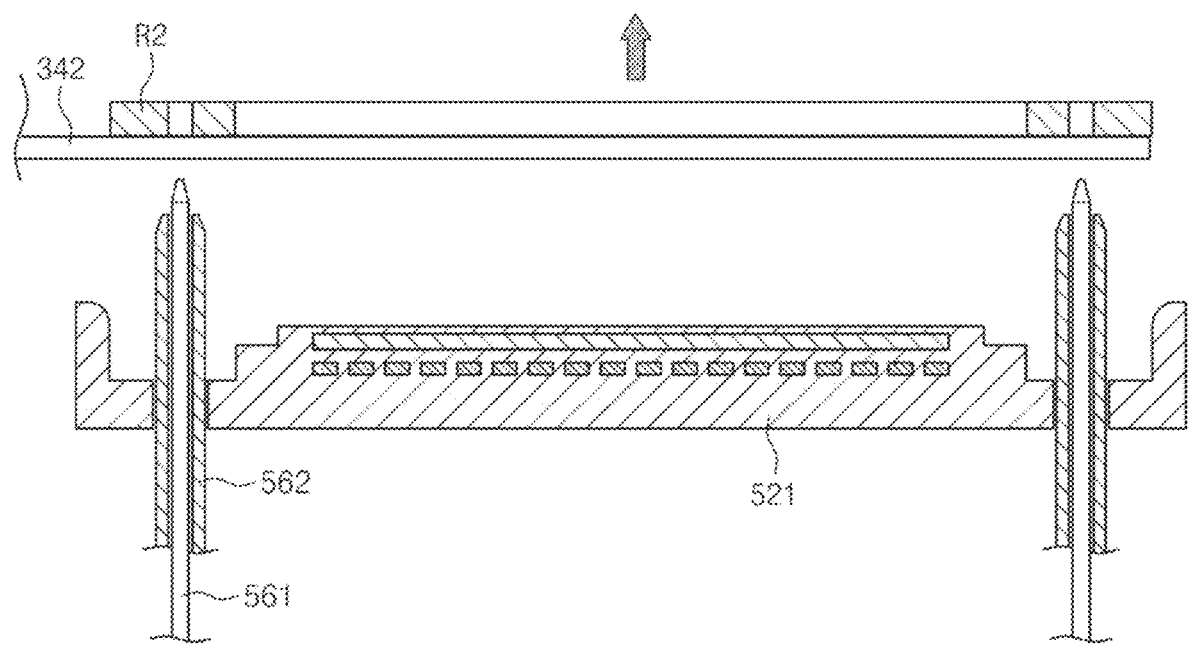
Figure 21:
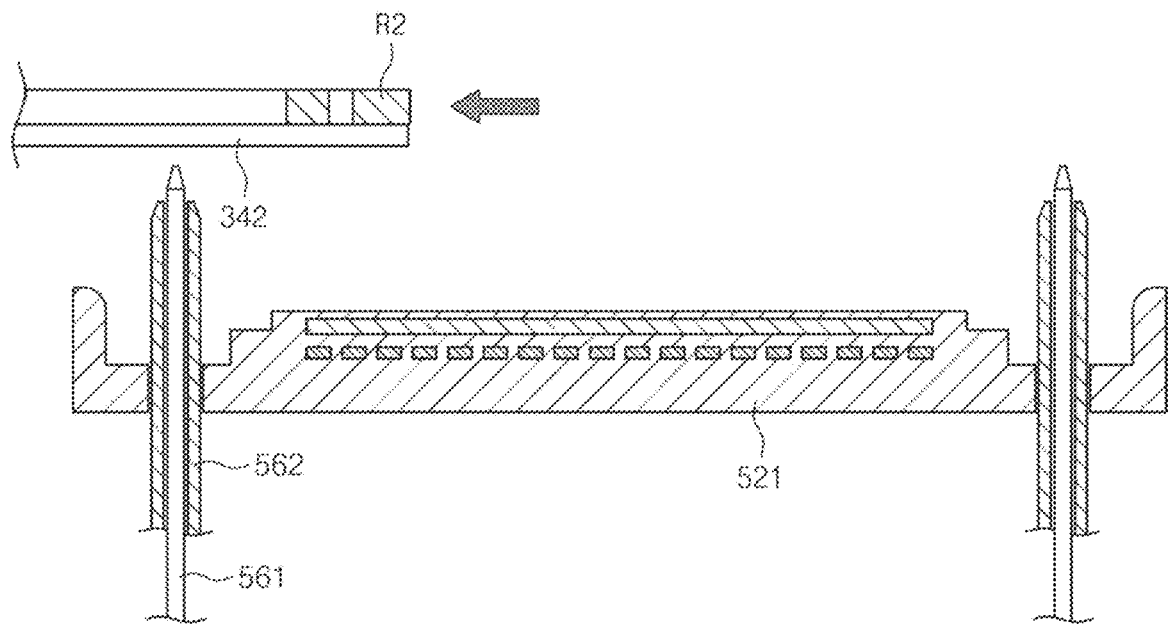

Firstly, the second pin 562 is positioned at a bottom side of the second ring R1. According to an embodiment, while a treatment is performed on the substrate W, the top end of the second pin 562 may be positioned below a bottom end of the second ring R2. In addition, while the first pin 561 transfers the first ring R1 to the outside of the process chamber 50, the top end of the second pin 562 may be positioned below the bottom end of the second ring R2. The second driving mechanism 564 (see FIG. 10) lifts and lowers the second pin 562. More specifically, the second driving mechanism 564 lifts the second pin 562 from the bottom side of the second ring R2. Subsequently, the top end of the second pin 562 is in contact with the bottom end of the second ring R2. As illustrated in FIG. 18, the second pin 562 lifts the second ring R2 from the top surface of the dielectric plate 521 to a position spaced apart from each other by a predetermined distance in the upward direction. If the second pin 562 lifts the second ring R2 to a position spaced apart in the upward direction from the top surface of the dielectric plate 521, the second transfer hand 342 enters the process chamber 50 as shown in FIG. 19. Selectively, while the second pin 562 is lifted, the second transfer hand 342 may enter the process chamber 50. The second transfer hand 342 is aligned at a position at which the second ring R2 may be seated on the second transfer hand 342. The second transfer hand 342 is aligned below the second ring R2 and lifts the second ring R2 from the bottom to the top as shown in FIG. 20. Thereafter, as illustrated in FIG. 21, the second transfer hand 342 transfers the second ring R2 to the outside of the process chamber 50 if the second ring R2 is taken from the second pin 562 to the second transfer hand 342.

Figure 22:
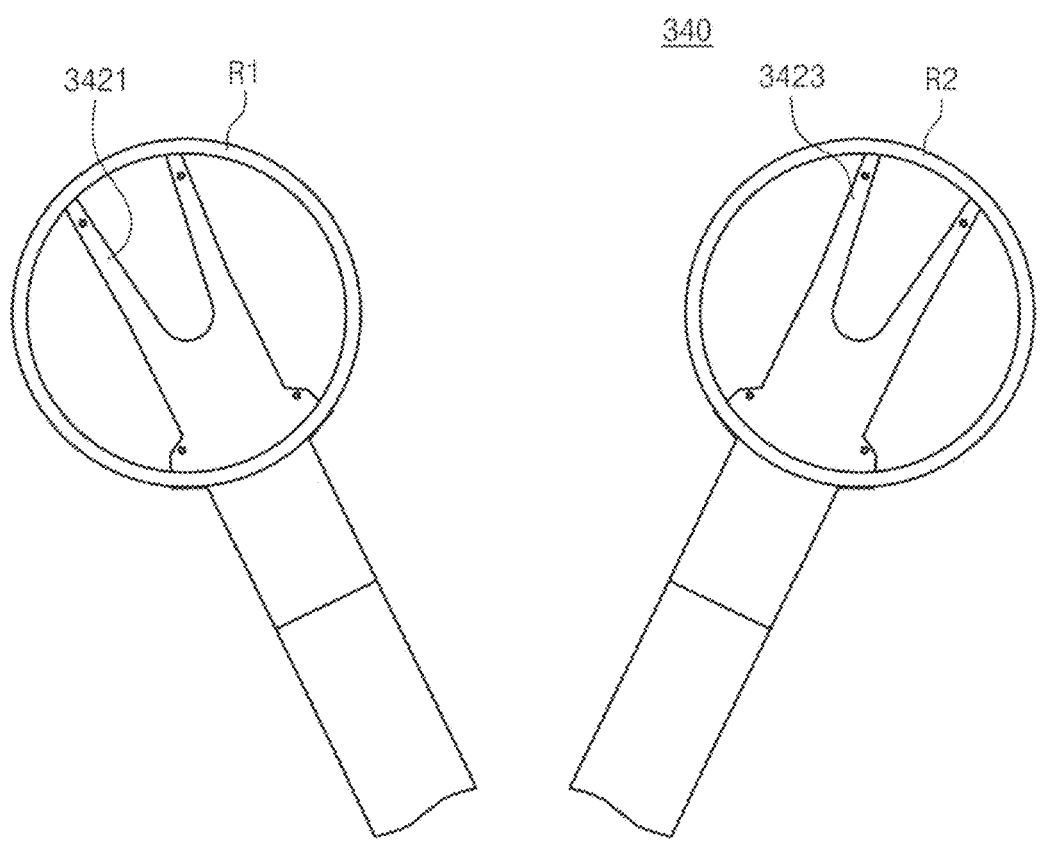

In an embodiment, while the second ring transfer hand 3423 transfers the second ring R2 to the outside of the process chamber 50, the first ring transfer hand 3421 holds the first ring R1 on the first ring transfer hand 3421. The first ring R1 and the second ring R2 are transferred to the outside of the process chamber 50 and placed on the first ring transfer hand 3421 and the second ring transfer hand 3423, respectively, as shown in FIG. 22.

Alternatively, before the second ring transfer hand 3423 transfers the second ring R2 to the outside of the process chamber 50, the second transfer robot 340 may transfer the first ring R1 to the load lock chamber 40 (refer to FIG. 7).

Figure 23:
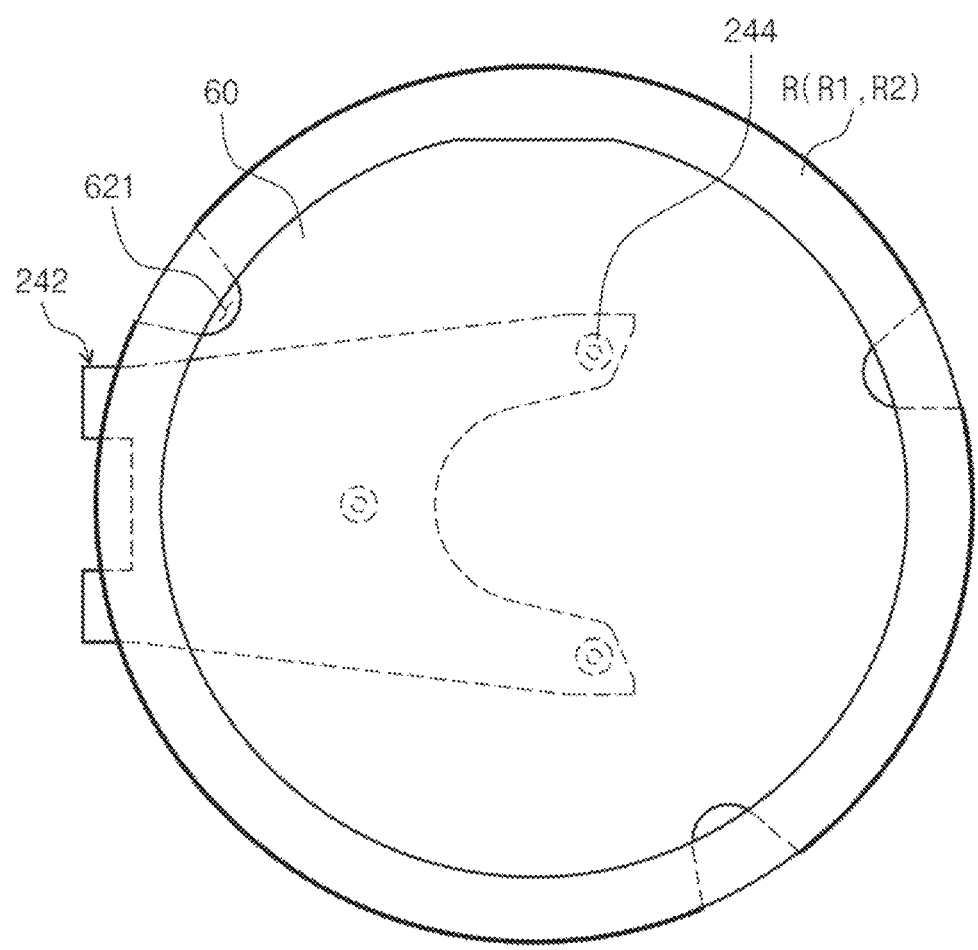

The first ring R1 and the second ring R2 are transferred to the load lock chamber 40 (refer to FIG. 7 and FIG. 8) by the second transfer robot 340, respectively. Thereafter, the first transfer robot 240 (refer to FIG. 1) takes out the ring carrier from the container F and mounts the ring carrier on the first transfer hand 242. The first transfer robot 240 moves to the load lock chamber 40. The first transfer robot 240 moves from a bottom to a top at a position at which the notch 621 formed in the ring carrier 60 first transfer hand 242 is aligned to mount the first ring R1 or the second ring R2 on the ring carrier 60 seated on the first transfer hand 242 as illustrated in FIG. 23. In an embodiment, the first ring R1 is seated on the first transfer hand 242 and the second ring R2 is seated on the other first transfer hand 242.

As shown in FIG. 1, the first transfer robot 240 may transfer the first ring and the second ring by the load port 10 to store within the container F. Afterwards, the first transfer robot 240 may take out the a new first ring and a new second ring from the container F.

Figure 24:
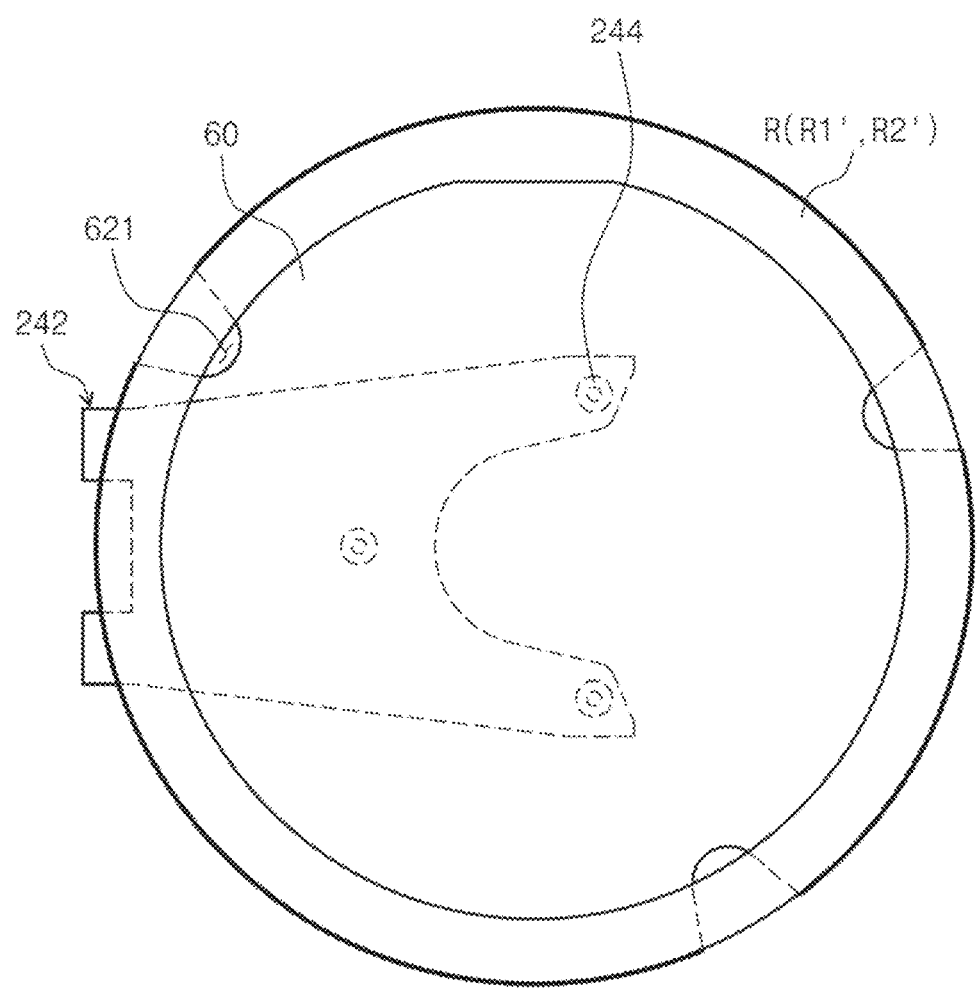
Figure 25:
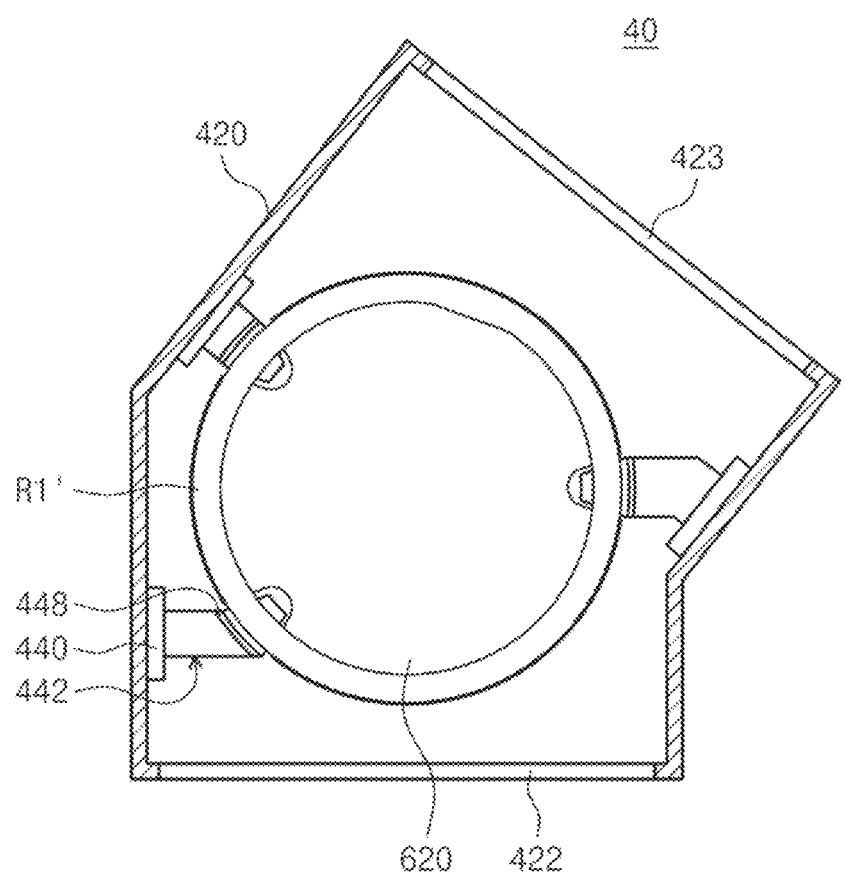
Figure 26:
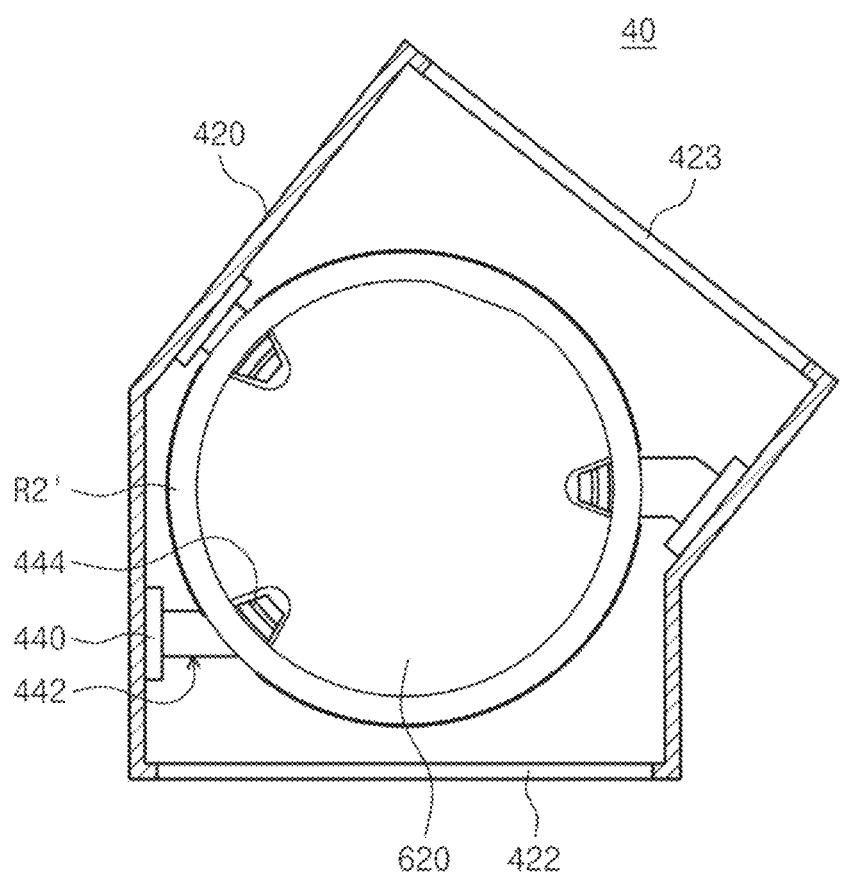
Figure 27:
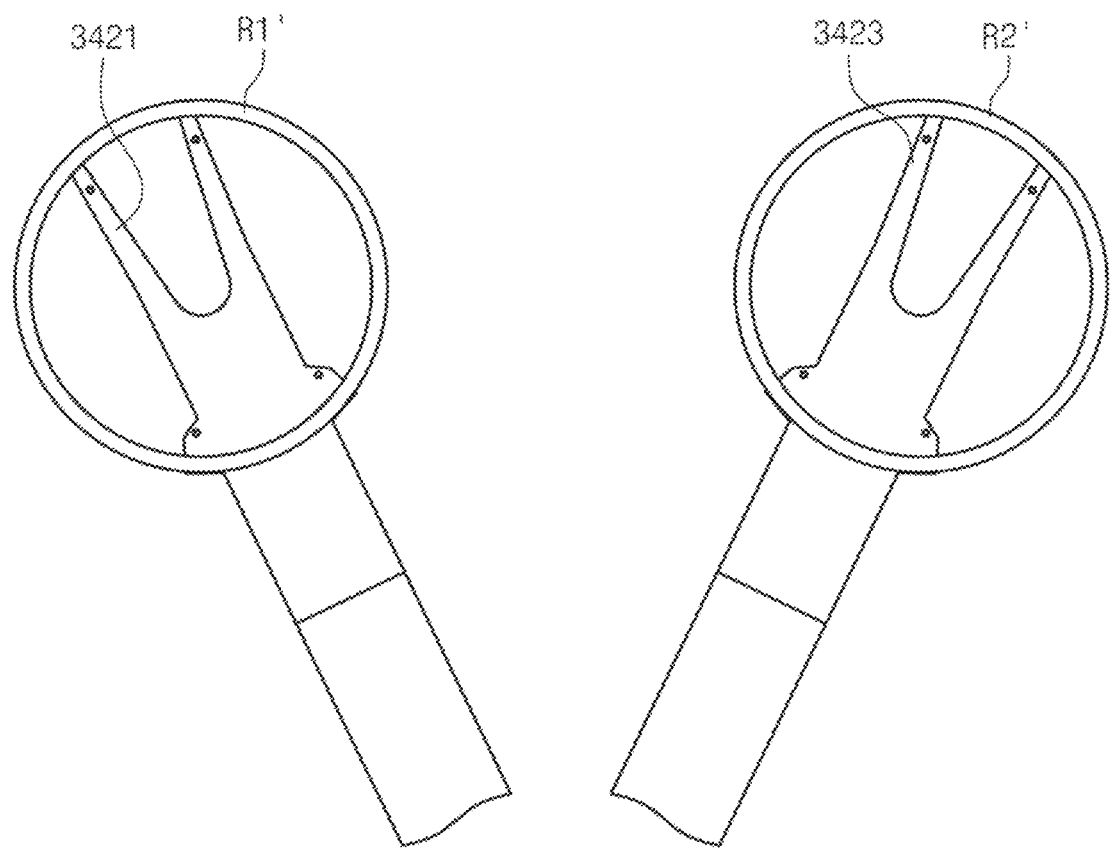

The replaced first ring R1' and replaced second ring R2' are seated on the ring carrier 60 on the first transfer hand 242, as illustrated in FIG. 24. The first transfer robot 240 takes back the replaced first ring R1' and the replaced second ring R2' to the load lock chamber 40, respectively, as shown in FIG. 25 to FIG. 26 to mount on the support protrusion 440. Thereafter, the second transfer robot 340 takes out the first ring R1' and the second ring R2' in the load lock chamber 40. As shown in FIG. 27, the first ring R'1 and the second ring R2' are placed on the second transfer hand 342. In an embodiment, the first ring R1' may be placed on the first ring transfer hand 3421, and the second ring R2' may be placed on the second ring transfer hand 3423. The second transfer hand 342 sequentially carries the second ring R2' and the first ring R1' into the process chamber 50.

Figure 28:
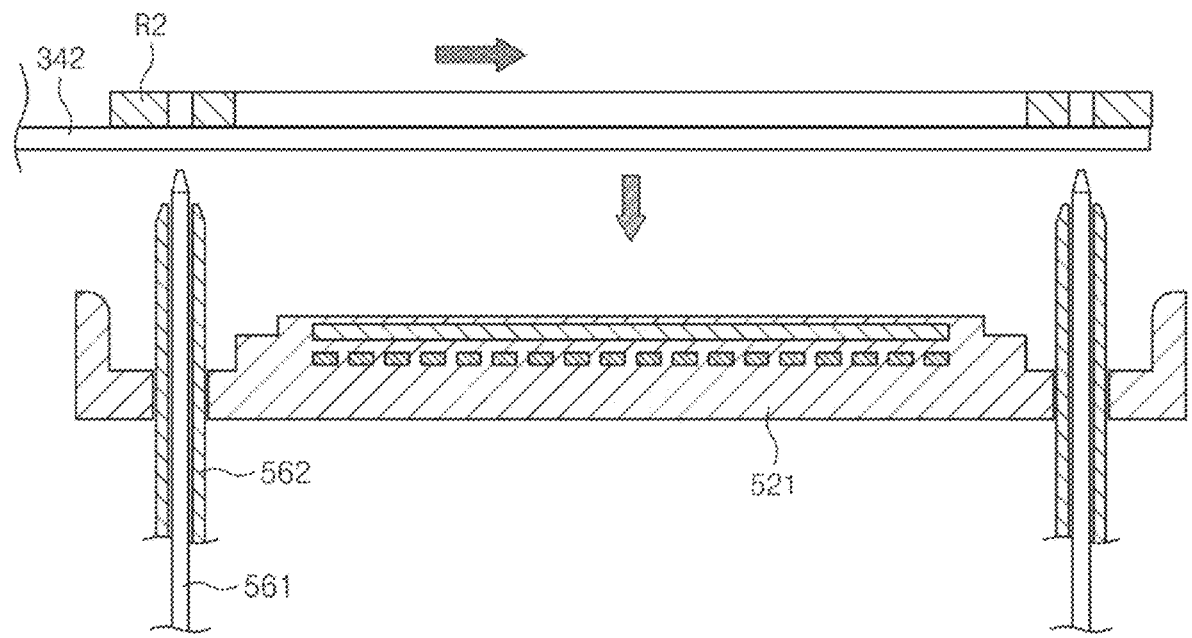
Figure 29:
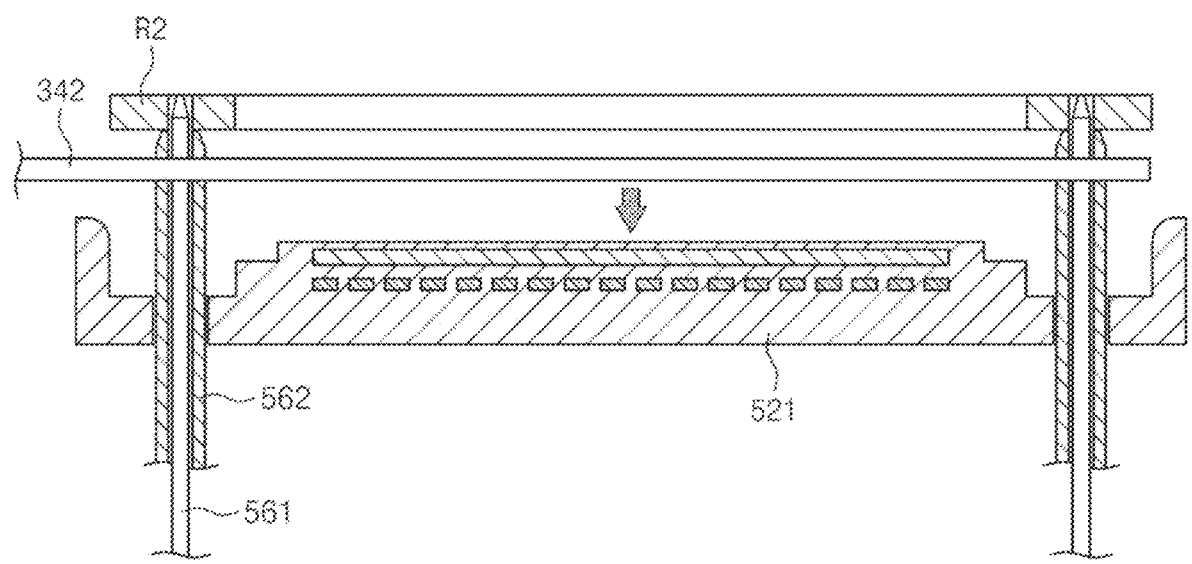
Figure 30:
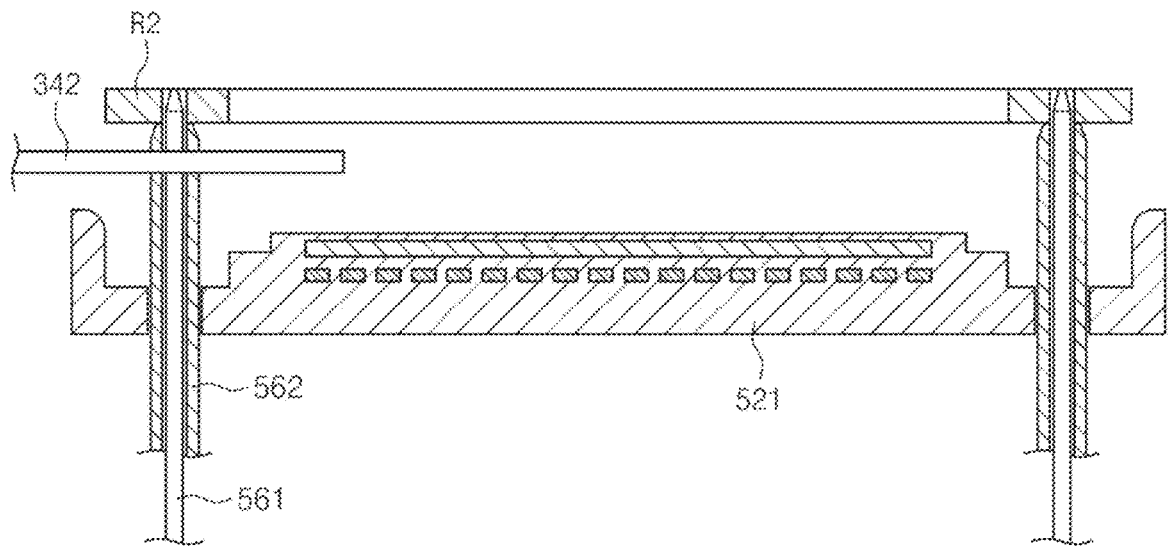
Figure 31:
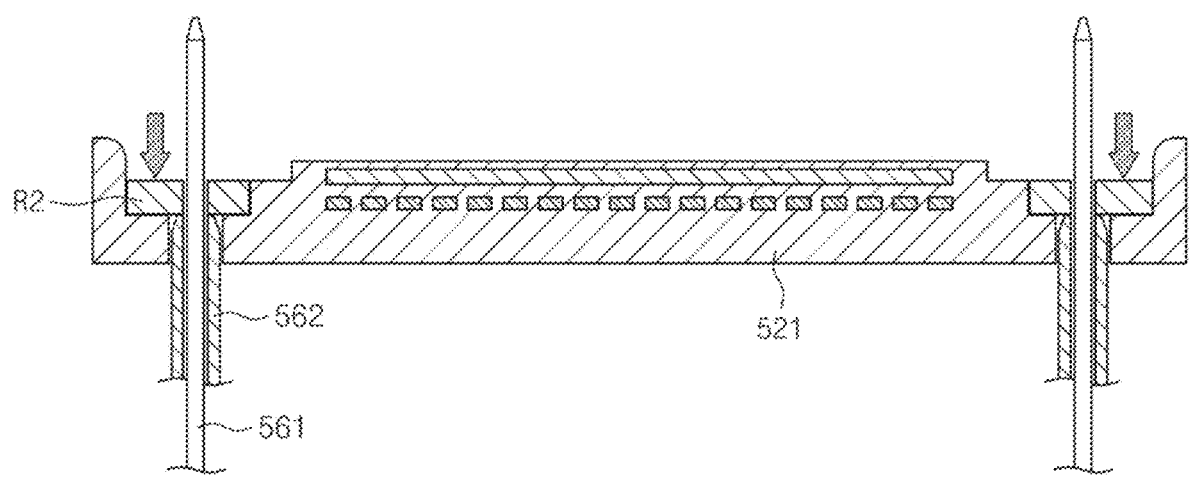

First, as illustrated in FIG. 28, if the second ring R2' is seated on the support plate, the second ring R2' is positioned on the second pin 562 so that the through hole of the second ring R2' corresponds to the first pin 561. Thereafter, the second transfer hand 342 moves downwardly and mounts the second ring R2 on the second pin 562, as illustrated in FIG. 29. If the second ring R2' is seated on the second pin 562, the second transfer hand 342 moves lower than the second pin 562. That is, the second transfer hand 342 moves the second ring R2 to the second pin 562. After the second ring R2' is seated on the second pin 562, the second transfer hand 342 exits the process chamber 50, as illustrated in FIG. 30. In an embodiment, if the second ring R2' is seated, the top end of the second pin 562 is placed below the top end. Accordingly, if the second ring R2' is lowered, the first pin 561 may be inserted in the through hole. Therefore, the second pin 562 may be lowered seat the second ring R2 on the dielectric plate 521. As illustrated in FIG. 31, if the second ring R2' is seated on the support plate, the first ring transfer hand 3421 takes the first ring R1 into the process chamber 50.

Figure 32:
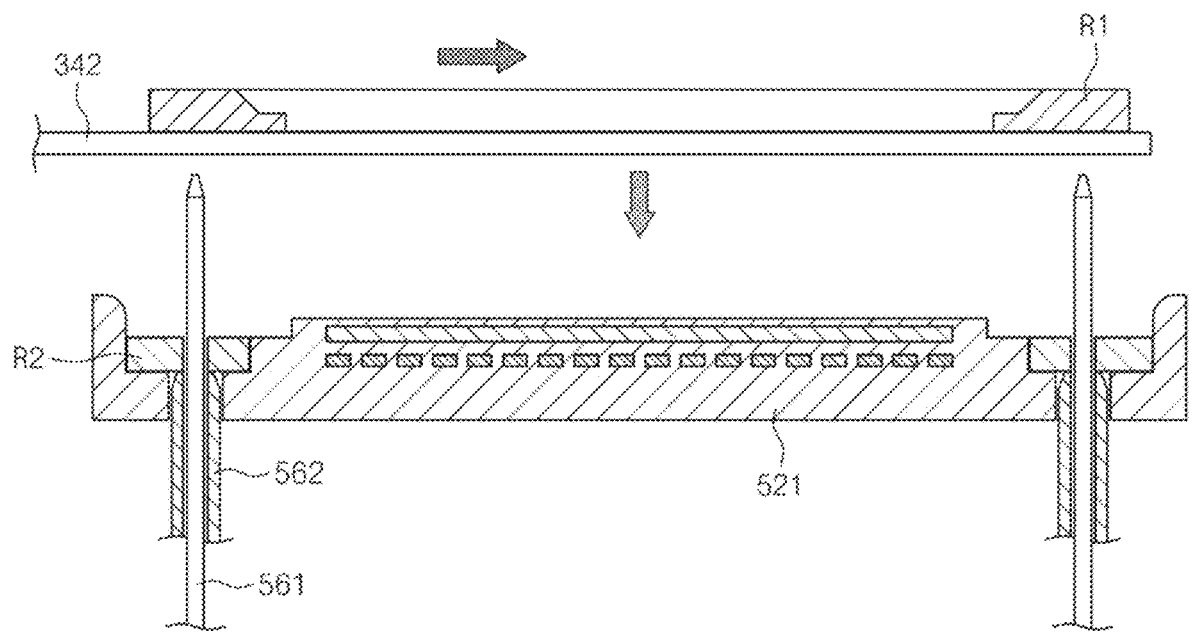
Figure 33:
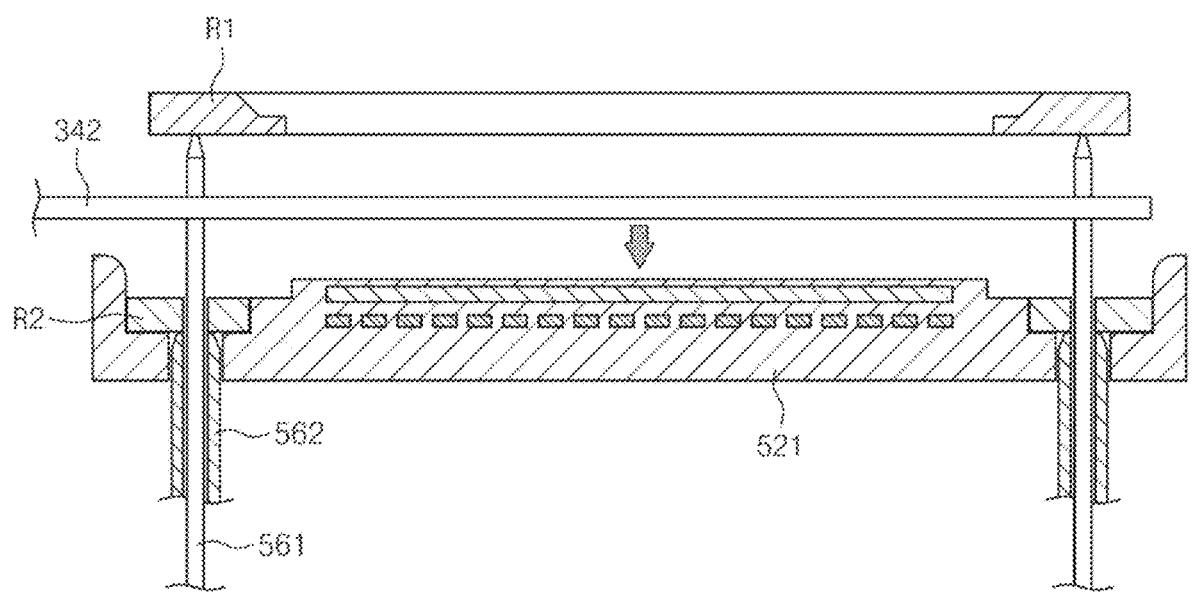
Figure 34:
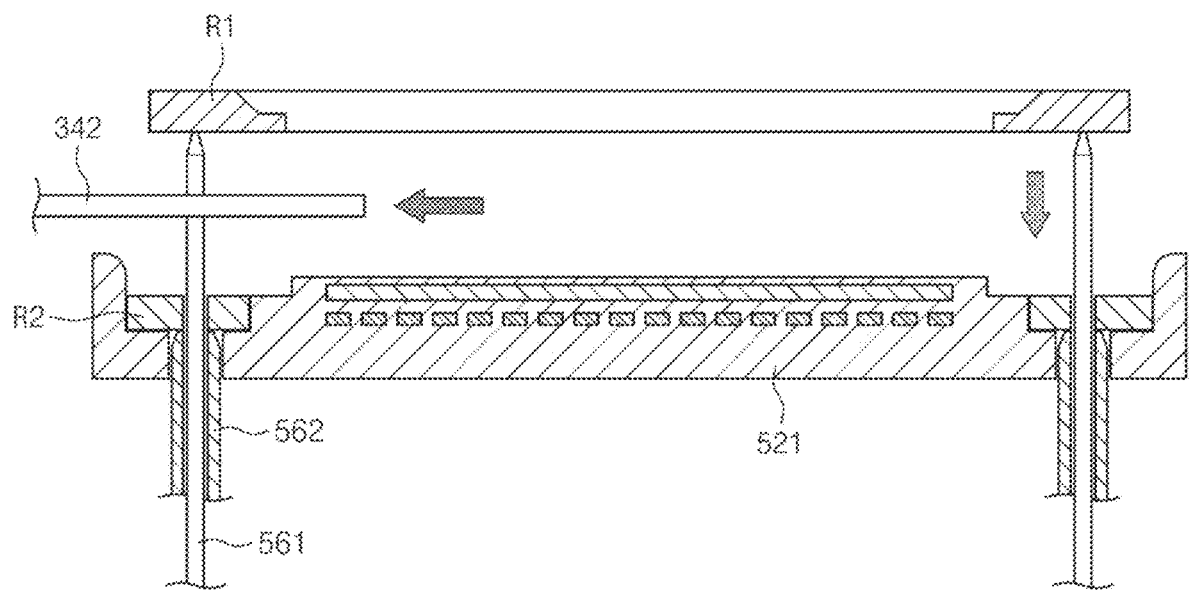
Figure 35:
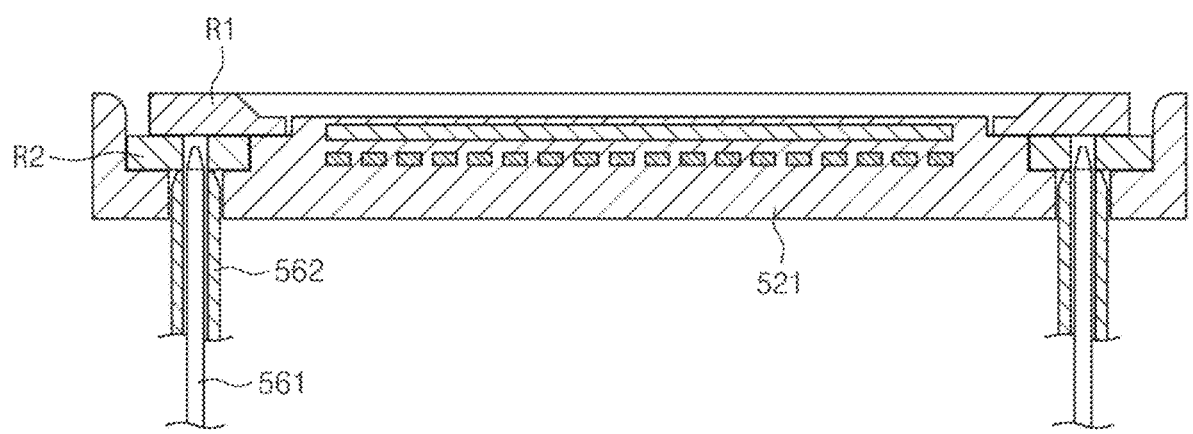

Afterwards, the first ring transfer hand 3421 enters process chamber 50 and mounts the first ring R1' on the support plate. The first transfer hand 3421 positions the first ring R1 on the first pin 561 as illustrated in FIG. 32. The first ring transfer hand 3421 moves downwardly to mount the first ring R1 on the first pin 561. If the first ring R1 is seated on the first pin 561, the first ring transfer hand 3421 moves lower than the first pin 561. After the first ring R1 is seated on the first pin 561, the first ring transfer hand 3421 moves further downwardly than the first ring R1 as illustrated in FIG. 33. Thereafter, as illustrated in FIG. 34, the first ring transfer hand 3421 exits the process chamber 50, and as illustrated in FIG. 35, the first pin 561 is lowered and the first ring R1 is mounted on the support plate.

In the above-described example, it has been described that both the first ring R1 and the second ring R2 are replaced. However, unlike this, only one of the first ring R1 and the second ring R2 may be replaced. In an embodiment, if only the first ring R1 is replaced, a process of lifting or lowering the second ring R2 and a process of taking the second ring R2 in and out of the process chamber 50 may be omitted.

In an embodiment, if only the second ring R2 is replaced, the first ring R1 may be transferred to the outside of the process chamber 50, but may not be transferred to the load lock chamber and may remain in the first ring transfer hand 3421.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously transfer out the inventive concept without departing from the essence of the inventive concept claimed in the claims and the modifications should not be construed separately from the technical spirit or prospect of the inventive concept.

What is claimed is:
1. A substrate treating apparatus comprising:
a process chamber having a treating space therein;

a substrate support unit configured to support a substrate in the treating space;
a gas supply unit configured to supply a process gas to the treating space; and
a plasma source for generating a plasma from the process gas, and
wherein the substrate support unit comprises:
a support plate on which the substrate is placed;
a base which is positioned below the support plate;
a first ring provided to surround the substrate placed on the support unit;
a second ring provided below the first ring and having a through hole; and
a ring lift pin assembly for lifting and lowering the first ring and the second ring, and
wherein the ring lift pin assembly comprises:
a first pin provided to be inserted into the through hole and to lift and lower the first ring;
a second pin in a hollow shaft shape to lift and lower the second ring and having a hole at which first pin passes through within; and
a driving unit for driving the first pin and the second pin, and
wherein the through hole overlaps the first ring when seen from above.

2. The substrate treating apparatus of claim 1, wherein a bottom surface of the first ring and a top surface of the second ring contact each other at the substrate support unit.

3. The substrate treating apparatus of claim 1, wherein the first pin is provided to be able to protrude from a top of the second pin.

4. The substrate treating apparatus of claim 1, wherein the driving unit comprises:
a first driving mechanism for lifting and lowering the first pin; and
a second driving mechanism for lifting and lowering the second pin.

5. The substrate treating apparatus of claim 1, wherein the first pin is positioned at a more bottom side than the first ring while the substrate is being treated, and
the second pin is positioned at a more bottom side than the second ring while the substrate is being treated, and
the first pin moves in an upward direction while the first ring is transferred to contact the bottom surface of the first ring, and
the second pin moves in the upward direction while the second ring is transferred to contact a bottom surface of the second ring.

6. The substrate treating apparatus of claim 5, further comprising:
a transfer unit for taking in and taking out the first ring or the second ring to/from inside of the process chamber; and
a controller configured to control the driving unit and the transfer unit, and
wherein the controller configured to control the driving unit to lift the first pin from a bottom side of the first ring to a top side of the support plate, and controls the transfer unit to receive the first ring from the first pin, while the first ring is transferred.

7. The substrate treating apparatus of claim 6, wherein the controller configured to control the second pin to be lifted from a bottom side of the second ring to a top side of the support plate, and configured to control the transfer unit to receive the second ring from the second pin, while the second ring is transferred.

8. The substrate treating apparatus of claim 7, wherein the controller configured to control the driving unit and the transfer unit to lift the second ring after the first ring is taken to the transfer unit.

9. The substrate treating apparatus of claim 5, further comprising:
a transfer unit for taking in and taking out the first ring or the second ring to/from inside of the process chamber; and
a controller configured to control the driving unit and the transfer unit, and
wherein the controller configured to control the transfer unit to take the second ring to the second pin, after the second ring is positioned so the through hole of the second ring and the first pin overlap when seen from above, when the second ring is mounted on the support plate, and
configured to control the driving unit to lower the second pin so the second ring is mounted on the support plate.

10. The substrate treating apparatus of claim 9, wherein the controller configured to control the transfer unit to transfer the first ring to the first pin, when the first ring is mounted on the support plate, after the second ring is mounted on the support plate, and
configured to control the driving unit to lower the first pin so the first ring is mounted on the support plate.

11. A substrate support unit provided within a process chamber and having a substrate placed thereon comprising:
a support plate on which the substrate placed;
a first ring provided to surround the substrate placed on the support plate;
a second ring provided below the first ring and having a through hole; and
a ring lift pin assembly for lifting and lowering the first ring and the second ring, and
wherein the ring lift pin assembly comprises:
a first pin provided to be inserted into the through hole and for lifting and lowering the first ring;
a second pin in a hollow shape for lifting and lowering the second ring and having a hole for letting the first pin passes through within; and
a driving unit for driving the first pin and the second pin, and
wherein the through hole overlaps the first ring when seen from above.

12. The substrate support unit of claim 11, wherein a bottom surface of the first ring and a top surface of the second ring are placed to contact each other on the substrate support unit.

13. The substrate support unit of claim 11, wherein the first pin is provided to so it may protrude from a top of the second pin.

14. The substrate support unit of claim 11, wherein the first pin is positioned at a more bottom side than the first ring while the substrate is being treated, and
the second pin is positioned at a more bottom side than the second ring while the substrate is being treated, and
the first pin moves in an upward direction while the first ring is transferred to contact a bottom surface of the first ring, and
the second pin moves in the upward direction while the second ring is transferred to contact a bottom surface of the second ring.

15. The substrate support unit of claim 11, further comprising a controller configured to control the driving unit, and wherein the controller configured to control the driving unit to remove the first ring from the first pin after the first pin is lifted from a bottom side of the first ring to a top side of the support plate, while the first ring is transferred to an outside of the process chamber, and to remove the second ring from the second pin after the second pin is lifted from a bottom side of the second ring to a top side of the support plate, while the second ring is transferred to an outside of the process chamber.

16. The substrate support unit of claim 15, wherein the second ring is transferred to the outside of the process chamber after the first ring is transferred to the outside of the process chamber.

17. The substrate support unit of claim 16, wherein the controller configured to control the driving unit to mount the second ring on the support plate by lowering the second pin having the second ring mounted thereon, and to mount the first ring on the support plate by lowering the first pin having the first ring mounted thereon, after the second ring is mounted on the support plate.

\* \* \* \* \*